(12) United States Patent
Whitefield et al.

(10) Patent No.: US 9,960,747 B2
(45) Date of Patent: May 1, 2018

(54) INTEGRATED FILTER AND DIRECTIONAL COUPLER ASSEMBLIES

(71) Applicant: SKYWORKS SOLUTIONS, INC., Woburn, MA (US)

(72) Inventors: David Scott Whitefield, Andover, MA (US); Sriram Srinivasan, Bedford, MA (US); Zhiyang Liu, Dunstable, MA (US); Nuttapong Srirattana, Billerica, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days. days.

(21) Appl. No.: 15/434,264

(22) Filed: Feb. 16, 2017

(65) Prior Publication Data
US 2017/0250666 A1 Aug. 31, 2017

Related U.S. Application Data

(60) Provisional application No. 62/439,208, filed on Dec. 27, 2016, provisional application No. 62/364,578,
(Continued)

(51) Int. Cl.
| | |
|---|---|
| *H04B 1/10* | (2006.01) |
| *H03H 7/01* | (2006.01) |
| *H03F 3/19* | (2006.01) |
| *H03F 3/24* | (2006.01) |
| *H04B 1/40* | (2015.01) |
| *H03H 7/06* | (2006.01) |

(52) U.S. Cl.
CPC ........... *H03H 7/0138* (2013.01); *H03F 3/19* (2013.01); *H03F 3/245* (2013.01);
(Continued)

(58) Field of Classification Search
CPC .. H03H 7/0138; H03H 7/0115; H03H 7/1758; H03H 7/1791; H03H 2210/025; H04B 1/40
(Continued)

(56) References Cited

U.S. PATENT DOCUMENTS

| | | |
|---|---|---|
| 3,611,199 A | 10/1971 | Safran |
| 3,868,594 A | 2/1975 | Cornwell et al. |
| | (Continued) | |

FOREIGN PATENT DOCUMENTS

| | | |
|---|---|---|
| EP | 2503701 A2 | 9/2012 |
| JP | S62-159502 A | 7/1987 |
| | (Continued) | |

OTHER PUBLICATIONS

International Search Report and Written Opinion from corresponding International Application No. PCT/US2017/018045 dated Apr. 25, 2017.

*Primary Examiner* — Sonny Trinh
(74) *Attorney, Agent, or Firm* — Lando & Anastasi, LLP

(57) ABSTRACT

Integrated filter and electromagnetic coupler assemblies. In certain examples, an integrated filter and electromagnetic coupler assembly includes a filter having a capacitance and a series inductance, the series inductance being connected between an input port and an output port of the integrated filter and electromagnetic coupler assembly, and combination of the capacitance and the series inductance being selected to provide the filter with a passband and a stopband. The integrated filter and electromagnetic coupler assembly further includes a coupling element positioned physically proximate the series inductance and extending between a coupled port and an isolation port of the integrated filter and electromagnetic coupler assembly, the integrated filter and electromagnetic coupler assembly being configured to provide at the coupled port a coupled signal via inductive coupling between the series inductance and the coupling element responsive to receiving an input signal at the input port.

21 Claims, 25 Drawing Sheets

Related U.S. Application Data filed on Jul. 20, 2016, provisional application No. 62/300,994, filed on Feb. 29, 2016.

(52) U.S. Cl.
CPC ........ *H03H 7/0115* (2013.01); *H03H 7/0153* (2013.01); *H03H 7/06* (2013.01); *H03H 7/1758* (2013.01); *H03H 7/1766* (2013.01); *H04B 1/40* (2013.01); *H03F 2200/171* (2013.01); *H03F 2200/294* (2013.01); *H03F 2200/451* (2013.01); *H03H 2210/025* (2013.01)

(58) Field of Classification Search
USPC .................................................. 455/307, 296
See application file for complete search history.

(56) References Cited

U.S. PATENT DOCUMENTS

| | | | |
|---|---|---|---|
| 4,460,875 A | 7/1984 | Harman | |
| 4,677,399 A | 6/1987 | Le Dain et al. | |
| 4,764,740 A | 8/1988 | Meyer | |
| 5,038,112 A | 8/1991 | O'Neill | |
| 5,222,246 A | 6/1993 | Wolkstein | |
| 5,276,411 A | 1/1994 | Woodin, Jr. et al. | |
| 5,363,071 A | 11/1994 | Schwent et al. | |
| 5,487,184 A | 1/1996 | Nagode | |
| 5,625,328 A | 4/1997 | Coleman, Jr. | |
| 5,745,016 A | 4/1998 | Salminen | |
| 5,767,753 A | 6/1998 | Ruelke | |
| 5,903,820 A * | 5/1999 | Hagstrom | H04B 1/40 |
| | | | 333/124 |
| 6,020,795 A | 2/2000 | Kim | |
| 6,078,299 A | 6/2000 | Scharfe, Jr. | |
| 6,108,527 A | 8/2000 | Urban et al. | |
| 6,329,880 B2 | 12/2001 | Akiya | |
| 6,496,708 B1 | 12/2002 | Chan et al. | |
| 6,559,740 B1 | 5/2003 | Schulz et al. | |
| 6,771,141 B2 | 8/2004 | Iida et al. | |
| 6,972,640 B2 | 12/2005 | Nagamori et al. | |
| 7,042,309 B2 | 5/2006 | Podell | |
| 7,236,069 B2 | 6/2007 | Puoskari | |
| 7,305,223 B2 | 12/2007 | Liu et al. | |
| 7,319,370 B2 | 1/2008 | Napijalo | |
| 7,336,142 B2 | 2/2008 | Vogel | |
| 7,493,093 B2 | 2/2009 | Boerman et al. | |
| 7,538,635 B2 | 5/2009 | Fukuda et al. | |
| 7,546,089 B2 | 6/2009 | Bellantoni | |
| 7,966,140 B1 | 6/2011 | Gholson, III et al. | |
| 8,175,554 B2 | 5/2012 | Camuffo et al. | |
| 8,248,302 B2 | 8/2012 | Tsai et al. | |
| 8,289,102 B2 | 10/2012 | Yamamoto et al. | |
| 8,315,576 B2 | 11/2012 | Jones | |
| 8,417,196 B2 | 4/2013 | Kitching et al. | |
| 8,526,890 B1 | 9/2013 | Chien et al. | |
| 8,606,198 B1 | 12/2013 | Wright | |
| 8,633,761 B2 * | 1/2014 | Lee | H03F 1/56 |
| | | | 327/108 |
| 8,761,026 B1 | 6/2014 | Berry et al. | |
| 8,810,331 B2 * | 8/2014 | Gu | H03H 7/0153 |
| | | | 333/17.1 |
| 9,014,647 B2 | 4/2015 | Kitching et al. | |
| 9,214,967 B2 | 12/2015 | Reisner et al. | |
| 9,356,330 B1 | 5/2016 | Donoghue et al. | |
| 9,425,835 B2 * | 8/2016 | Seckin | H04B 1/0475 |
| 9,496,902 B2 | 11/2016 | Srirattana et al. | |
| 9,553,617 B2 | 1/2017 | Srirattana et al. | |
| 9,634,371 B2 | 4/2017 | Swarup et al. | |
| 9,755,670 B2 * | 9/2017 | Chen | H04B 1/04 |
| 2002/0097100 A1 | 7/2002 | Woods et al. | |
| 2002/0113666 A1 | 8/2002 | Yamazaki et al. | |
| 2002/0139975 A1 | 10/2002 | Lewis et al. | |
| 2003/0214365 A1 | 11/2003 | Adar et al. | |
| 2004/0127178 A1 | 7/2004 | Kuffner | |
| 2004/0201526 A1 | 10/2004 | Knowles et al. | |
| 2005/0017821 A1 | 1/2005 | Sawicki | |
| 2005/0040912 A1 | 2/2005 | Pelz | |
| 2005/0146394 A1 | 7/2005 | Podell | |
| 2005/0170794 A1 | 8/2005 | Koukkari et al. | |
| 2005/0239421 A1 | 10/2005 | Kim et al. | |
| 2006/0232359 A1 | 10/2006 | Fukuda et al. | |
| 2007/0082642 A1 | 4/2007 | Hattori | |
| 2007/0159268 A1 | 7/2007 | Podell | |
| 2008/0036554 A1 | 2/2008 | Krausse et al. | |
| 2008/0055187 A1 | 3/2008 | Tamura et al. | |
| 2008/0056638 A1 | 3/2008 | Glebov et al. | |
| 2008/0070519 A1 | 3/2008 | Okabe | |
| 2008/0112466 A1 | 5/2008 | Sasaki | |
| 2009/0134953 A1 | 5/2009 | Hunt et al. | |
| 2009/0195335 A1 | 8/2009 | Wahl et al. | |
| 2009/0278624 A1 | 11/2009 | Tsai et al. | |
| 2009/0280755 A1 | 11/2009 | Camuffo et al. | |
| 2009/0322313 A1 | 12/2009 | Zhang et al. | |
| 2011/0057746 A1 | 3/2011 | Yamamoto et al. | |
| 2011/0063044 A1 | 3/2011 | Jones | |
| 2011/0148548 A1 | 6/2011 | Uhm et al. | |
| 2011/0199166 A1 | 8/2011 | Carrillo-Ramirez | |
| 2011/0254637 A1 | 10/2011 | Manssen et al. | |
| 2011/0279192 A1 | 11/2011 | Nash et al. | |
| 2011/0298559 A1 | 12/2011 | Kitching et al. | |
| 2012/0019332 A1 | 1/2012 | Hino et al. | |
| 2012/0019335 A1 | 1/2012 | Hoang et al. | |
| 2012/0062333 A1 | 3/2012 | Ezzeddine et al. | |
| 2012/0071123 A1 | 3/2012 | Jones et al. | |
| 2012/0243579 A1 | 9/2012 | Premakanthan et al. | |
| 2013/0005284 A1 | 1/2013 | Dalipi | |
| 2013/0113575 A1 | 5/2013 | Easter | |
| 2013/0194054 A1 | 8/2013 | Presti | |
| 2013/0207741 A1 | 8/2013 | Presti | |
| 2013/0241668 A1 | 9/2013 | Tokuda et al. | |
| 2013/0293316 A1 | 11/2013 | Kitching et al. | |
| 2013/0307635 A1 | 11/2013 | Kase et al. | |
| 2014/0152253 A1 | 6/2014 | Ozaki et al. | |
| 2014/0266499 A1 | 9/2014 | Noe | |
| 2014/0368293 A1 | 12/2014 | Mukaiyama | |
| 2015/0002239 A1 | 1/2015 | Tanaka | |
| 2015/0042412 A1 * | 2/2015 | Imbornone | H01P 5/18 |
| | | | 333/112 |
| 2015/0043669 A1 | 2/2015 | Ella et al. | |
| 2015/0048910 A1 | 2/2015 | LaFountain et al. | |
| 2015/0091668 A1 | 4/2015 | Solomko et al. | |
| 2015/0200437 A1 | 7/2015 | Solomko et al. | |
| 2015/0249485 A1 | 9/2015 | Ouyang et al. | |
| 2015/0270821 A1 | 9/2015 | Natarajan et al. | |
| 2015/0326202 A1 | 11/2015 | Nicholls et al. | |
| 2015/0349742 A1 | 12/2015 | Chen et al. | |
| 2015/0372366 A1 | 12/2015 | Frye | |
| 2016/0025928 A1 | 1/2016 | Onawa | |
| 2016/0028147 A1 | 1/2016 | Srirattana et al. | |
| 2016/0028420 A1 | 1/2016 | Srirattana et al. | |
| 2016/0043458 A1 | 2/2016 | Sun et al. | |
| 2016/0065167 A1 | 3/2016 | Granger-Jones et al. | |
| 2016/0079649 A1 | 3/2016 | Ilkov et al. | |
| 2016/0079650 A1 | 3/2016 | Solomko et al. | |
| 2016/0172737 A1 | 6/2016 | Srirattana et al. | |
| 2016/0172738 A1 | 6/2016 | Srirattana et al. | |
| 2016/0172739 A1 | 6/2016 | Srirattana et al. | |
| 2016/0172740 A1 | 6/2016 | Srirattana et al. | |
| 2016/0268994 A1 | 9/2016 | Granger-Jones et al. | |
| 2016/0344430 A1 | 11/2016 | Srirattana et al. | |
| 2016/0344431 A1 | 11/2016 | Srirattana et al. | |
| 2017/0033428 A1 | 2/2017 | Ootsuka et al. | |
| 2017/0063425 A1 | 3/2017 | Khlat et al. | |
| 2017/0085245 A1 | 3/2017 | Srirattana et al. | |

FOREIGN PATENT DOCUMENTS

| | | |
|---|---|---|
| JP | 2000-077915 A | 3/2000 |
| JP | 2013126067 A | 6/2013 |
| KR | 20040037465 A | 5/2004 |
| KR | 20110118289 A | 10/2011 |
| KR | 20120007790 A | 1/2012 |

(56) References Cited

FOREIGN PATENT DOCUMENTS

| | | |
|---|---|---|
| WO | 2005018451 A1 | 3/2005 |
| WO | 2015020927 A2 | 2/2015 |
| WO | 2015134979 A1 | 9/2015 |

\* cited by examiner

INTEGRATED FILTER AND DIRECTIONAL COUPLER ASSEMBLIES

CROSS-REFERENCE TO RELATED APPLICATIONS

This application claims the benefits under 35 U.S.C. § 119(e) of U.S. Provisional Application Nos. 62/300,994 filed on Feb. 29, 2016, 62/364,578 filed on Jul. 20, 2016, and 62/439,208 filed on Dec. 27, 2016, each of which is herein incorporated by reference in its entirety for all purposes.

BACKGROUND

Electromagnetic couplers, such as radio frequency (RF) couplers, are used in a variety of applications to extract a signal for measurement, monitoring, or other uses. For example, an RF coupler can be included in a signal path between an RF source and a load (such as an antenna) to provide an indication of forward RF power of the RF signal traveling from the RF source to the load and/or an indication of reverse RF power reflected back from the load. An RF coupler typically has a coupled port, an isolation port, a power input port, and a power output port. When a termination impedance is presented to the isolation port, an indication of forward RF power traveling from the power input port to the power output port is provided at the coupled port. When a termination impedance is presented to the coupled port, an indication of reverse RF power traveling from the power output port to the power input port is provided at the isolation port. The termination impedance is typically implemented by a 50 Ohm shunt resistor in a variety of conventional RF couplers.

FIG. 1 is a block diagram illustrating an example of a typical arrangement of an RF "front-end" sub-system or module (FEM) 100 as may be used in a communications device, such as a mobile phone, for example, to transmit RF signals. A power amplifier module 110 provides gain to an RF signal 105 input to the FEM 100, producing an amplified RF signal. The power amplifier module 110 can include one or more power amplifiers. The FEM 100 further includes a filtering sub-subsystem or module 120, which can include one or more filters in each of the transmit path (TX) and receive path (RX). In particular, in the transmit path the filter sub-system 120 is used to filter out unwanted frequencies from the amplified RF signal, but includes unwanted resistive loss in-band. A directional coupler 130 is used to extract a portion of the power from the RF signal traveling between the power amplifier module 110 and an antenna 140 connected to the FEM 100. The antenna 140 transmits the RF signal, and can receive RF signals. A switching circuit 150, also referred to as an antenna switch module (ASM), can be used to switch between a transmitting mode and receiving mode of the FEM 100, for example, or between different transmit or receive frequency bands. The switching circuit 150 can be operated under the control of a controller 160.

Referring to FIG. 2 there is illustrated a schematic representation of one example of the directional coupler 130 (also referred to as an RF coupler). The directional coupler 130 has a power input port 202 that receives the RF signal (e.g., from the power amplifier module 110 or filter sub-system 120), a transmitted port 204 (also referred to as a power output port) at which the RF signal is provided for transmission by the antenna 140, a coupled port 206, and an isolation port 208. The directional coupler 130 includes a main transmission line 210 that extends between the input port 202 and the transmitted port 204, and a coupled transmission line 212 that extends between the coupled port 206 and the isolation port 208. A termination impedance 214 is typically connected to the isolation port 208. The directional coupler 130 has a coupling factor, which represents how much power is provided to the coupled port 206 of the coupler relative to the power of the RF signal at the power input port 202. Directional/RF couplers typically cause an insertion loss in the RF signal path between the power amplifier module 110 and the antenna 140, in part due to the coupling factor. Thus, an RF signal received at the power input port 202 of the directional coupler 130 generally has a lower power when provided at the transmitted port 204 because some of the signal power has been coupled off and provided at the coupled port 206. Insertion loss can also be affected by losses associated with the main transmission line 210 of the directional coupler 130.

SUMMARY OF INVENTION

Aspects and embodiments relate to electronic systems and, in particular, to directional electromagnetic (EM) couplers, and to modules and electronic devices incorporating electromagnetic couplers.

As discussed above, conventional transmitting RF front-end sub-systems include both a filter 120 and an RF coupler 130, each having associated losses that reduce the power in the signal transmitted by the antenna 140. Conventional RF front-end sub-systems simply accept the size and loss associated with having an individual filter cascaded with an individual RF coupler, as shown in FIG. 1. Although the directional coupler 130 is shown in FIG. 1 positioned between the filter 120 and the switching circuit 150, those skilled in the art will appreciate that the directional coupler 130 may instead be positioned before the filter 120 or after the switching circuit 150. Aspects and embodiments are directed to an integrated filter-coupler module that leverages commonality between components of filters and EM couplers to reduce the overall size and loss associated with the combination of a filter and EM coupler in a communications system front-end sub-system or other electronic device.

According to one embodiment, an integrated filter and electromagnetic (EM) coupler assembly comprises a filter including a capacitance and a series inductance, the series inductance being connected between an input port and an output port, a combination of the capacitance and the series inductance being selected to provide the filter with a passband and a stopband. The integrated filter and electromagnetic coupler assembly further comprises a coupling element positioned physically proximate the series inductance and extending between a coupled port and an isolation port, the series inductance and the coupling element being configured to provide at the coupled port a coupled signal responsive to receiving an input signal at the input port.

In one example the integrated filter and EM coupler assembly further comprises a termination impedance connected to the isolation port. The termination impedance may be adjustable. In one example the termination impedance includes a switched network of a plurality of impedance elements. The plurality of impedance elements may include capacitors, inductors, or resistors.

The coupling element may be a transmission line or inductor, for example.

In one example the filter is a pi-type filter. In one example the capacitance includes a series capacitor connected in parallel with the series inductance, and the filter further includes a first shunt capacitor, a second shunt capacitor, a first shunt inductor, and a second shunt inductor, the first shunt capacitor and the first shunt inductor being connected in series between the input port and a ground, and the second shunt capacitor and the second shunt inductor being connected in series between the output port and the ground. The integrated filter and electromagnetic coupler may further comprise an additional coupling element positioned physically proximate the first shunt inductor and extending between an additional coupled port and an additional isolation port of the integrated filter and EM coupler assembly, the additional coupling element and the first shunt inductor being configured to provide at the additional coupled port a harmonic coupled signal via inductive coupling between the first shunt inductor and the additional coupling element responsive to receiving the input signal at the input port, the harmonic coupled signal being representative of at least one harmonic of the input signal. The integrated filter and electromagnetic coupler assembly may further comprise an additional termination impedance connected to the additional isolation port. In one example at least one of the series capacitor, the first shunt capacitor, and the second shunt capacitor has an adjustable capacitance value.

In another example the filter is an L-type filter. In another example the filter is a T-type filter.

In another example the filter is a multi-stage filter. In one example the series inductance includes a plurality of series inductors connected in series between the input port and the output port, the coupling element being positioned physically proximate a first one of the series inductors. The integrated filter and electromagnetic coupler assembly may further comprise an additional coupling element positioned physically proximate a second one of the series inductors, the additional coupling element being connected to an additional coupled port. In one example the additional coupling element and the second one of the series inductors are configured to provide an indication of power of a reflection of the input signal from the output port. In another example the coupling element and the first one of the series inductors are configured to provide at the coupled port the coupled signal in a first frequency band, and the additional coupling element and the second one of the series inductors are configured to provide at the additional coupled port an additional coupled signal in a second frequency band. The integrated filter and electromagnetic coupler assembly may further comprise at least one frequency selective component connected to a corresponding at least one of the coupled port and the additional coupled port. In another example the integrated filter and electromagnetic coupler assembly further comprises at least one additional coupling element positioned physically proximate at least one corresponding additional series inductor of the plurality of series inductors, the at least one additional coupling element being switchably connected between the coupling element and the isolation port.

According to another embodiment an integrated filter and electromagnetic coupler assembly comprises an input port, an output port, a coupled port, an isolation port, and a filter including a capacitance and a first series inductance, the first series inductance being connected along a series path between the input port and the output port. The integrated filter and electromagnetic coupler assembly further comprises a first coupling element positioned physically proximate the first series inductance and extending between the coupled port and the isolation port, the integrated filter and electromagnetic coupler assembly being configured to provide at the coupled port a first coupled signal via inductive coupling between the first series inductance and the first coupling element responsive to receiving an input signal at the input port, and a termination impedance connected to the isolation port.

In one example the filter further includes a second series inductance connected in series with the first series inductance between the input port and the output port. The integrated filter and electromagnetic coupler assembly may further comprise a second coupling element positioned physically proximate the second series inductance, and a pair of switches configured to connect the second coupling element to the first coupling element in series between the coupled port and the isolation port.

In one example the termination impedance is adjustable. The termination impedance may include a switched network of impedance elements, the impedance elements including resistors, capacitors, or inductors, for example.

In one example the filter is a pi-type filter. In another example the filter is an L-type filter. In another example the filter is a T-type filter.

In one example the capacitance includes at least one series capacitor connected in parallel with the first series inductance, and the filter further includes at least one shunt arm connected between the series path and a ground, the at least one shunt arm including a shunt capacitance and a shunt inductance connected in series with the shunt capacitance between the series path and the ground. The integrated filter and electromagnetic coupler assembly may further comprise a second coupling element positioned physically proximate the shunt inductance and extending between an additional coupled port and an additional isolation port of the integrated filter and electromagnetic coupler assembly, the integrated filter and electromagnetic coupler assembly being configured to provide at the additional coupled port a harmonic coupled signal via inductive coupling between the shunt inductance and the second coupling element responsive to receiving the input signal at the input port, the harmonic coupled signal being representative of at least one harmonic of the input signal.

In another example the capacitance includes at least one variable capacitor.

Certain embodiments are directed to a module comprising an example of the integrated filter and electromagnetic coupler assembly discussed above. The module may further comprise a packaging substrate. In one example at least one component of the integrated filter and electromagnetic coupler assembly is formed in the packaging substrate. In another example the integrated filter and electromagnetic coupler assembly is formed as a die mounted to the packaging substrate.

Certain embodiments are directed to a front-end module for a wireless device, the front end module comprising an example of the integrated filter and electromagnetic coupler assembly discussed above, a power amplifier module coupled to the input port of the integrated filter and electromagnetic coupler assembly and configured to provide the input signal, and an antenna coupled to the output port of the integrated filter and electromagnetic coupler assembly. The front-end module may further comprise an antenna switch connected between the output port of the integrated filter and electromagnetic coupler assembly and the antenna.

Another embodiment is directed to a wireless device comprising the front-end module, a transceiver coupled to the power amplifier module and configured to provide a transmit signal to the power amplifier module, the power amplifier module being configured to amplify the transmit signal to provide the input signal, and a sensor connected to the coupled port of the integrated filter and electromagnetic coupler assembly. In one example the wireless device may further comprise a low noise amplifier module connected between the antenna switch and the transceiver, the antenna being configured to receive transmitted signals, and the low noise amplifier being configured to receive the transmitted signals from the antenna switch and to amplify the transmitted signals.

Certain embodiments are directed to a front-end module for a wireless device, the front end module comprising an example of the integrated filter and electromagnetic coupler assembly discussed above, an antenna switch coupled to the input port of the integrated filter and electromagnetic coupler assembly and configured to provide the input signal, and an antenna coupled to the output port of the integrated filter and electromagnetic coupler assembly. The front-end module may further comprise a power amplifier module coupled to the antenna switch, the antenna switch being connected between the power amplifier module and the input port of the integrated filter and electromagnetic coupler assembly.

Another embodiment is directed to a wireless device comprising an example of the integrated filter and electromagnetic coupler assembly, and a power amplifier module coupled to the input port of the integrated filter and electromagnetic coupler assembly and configured to provide the input signal. In one example the wireless device further comprises an antenna coupled to the output port of the integrated filter and electromagnetic coupler assembly. In one example the wireless device further comprises a transceiver coupled to the power amplifier module and configured to provide a transmit signal to the power amplifier module, the power amplifier module being configured to amplify the transmit signal to provide the input signal, and an antenna switch module connected between the output port of the integrated filter and electromagnetic coupler assembly and the antenna, and between the antenna and the transceiver. The wireless device may further comprise a sensor connected to the coupled port of the integrated filter and electromagnetic coupler assembly and configured to detect the first coupled signal.

According to another embodiment, a wireless device comprises an example of the integrated filter and electromagnetic coupler assembly discussed above, an antenna switch coupled to the input port of the integrated filter and electromagnetic coupler assembly and configured to provide the input signal, an antenna coupled to the output port of the integrated filter and electromagnetic coupler assembly, a transceiver configured to provide a transmit signal, a power amplifier module coupled between the transceiver and the antenna switch, the power amplifier module being configured to receive and amplify the transmit signal to provide the input signal to the antenna switch, and a sensor connected to the coupled port of the integrated filter and electromagnetic coupler assembly and configured to detect the coupled signal.

According to another embodiment, a wireless device comprises an integrated filter-coupler module including a first integrated filter and electromagnetic coupler assembly as discussed above in which the input signal is a low-band signal, and a second integrated filter and electromagnetic coupler assembly as discussed above in which the input signal is a high-band signal. The wireless device further comprises a power amplifier module including a first power amplifier coupled to the input port of the first integrated filter and electromagnetic coupler assembly and configured to provide the low-band signal, and a second power amplifier coupled to the input port of the second integrated filter and electromagnetic coupler assembly and configured to provide the high-band signal, and an antenna coupled to the output port of the each of the first and second integrated filter and electromagnetic coupler assemblies. The wireless device may further comprise a transceiver coupled to the power amplifier module and configured to provide a low-band transmit signal and a high-band transmit signal to the power amplifier module, the power amplifier module being configured to amplify the low-band and high-band transmit signals to provide the low-band signal and the high-band signal to the integrated filter-coupler module.

In some embodiments, a wireless device comprises an integrated filter-coupler and switching module including an example of the integrated filter and electromagnetic coupler assembly discussed above and an antenna switch. The wireless device may further comprise a power amplifier module coupled to the input port of the integrated filter and electromagnetic coupler assembly and configured to provide the input signal, and a transceiver coupled to the power amplifier module and configured to provide a transmit signal to the power amplifier module, the power amplifier module being configured to amplify the transmit signal to provide the input signal, and a sensor connected to the coupled port of the integrated filter and electromagnetic coupler assembly.

According to another embodiment an integrated filter-coupler module comprises a plurality of input ports and an output port, a plurality of filter sections each including a capacitance and a first series-path inductive element connected along a series path between a corresponding one of the plurality of input ports and the output port, and a corresponding plurality of coupler sections each including a coupled port, an isolation port, a coupling element connected between the coupled port and the isolation port and positioned proximate the first series-path inductive element of an associated one of the plurality of filter sections, and a termination impedance connected to the isolation port, each coupler section of the plurality of coupler sections being configured to provide at the coupled port a coupled signal via inductive coupling between the first series inductance and the coupling element responsive to receiving an input signal at the corresponding one of the plurality of input ports.

Another embodiment is directed to a wireless device comprising an example of the integrated filter coupler module, an antenna connected to the output port, a transmitter circuit configured to generate a corresponding plurality of transmit signals of different frequencies, and a power amplifier module connected between the transmitter circuit and the plurality of input ports, the power amplifier module configured to receive and amplify the plurality of transmit signals to produce, from each transmit signal, the corresponding input signal provided to each of the plurality of input ports.

According to another embodiment, an integrated filter and electromagnetic coupler module for use in a diplexer, for example, comprises a first input port, a second input port, and an output port, a first integrated filter and electromagnetic coupler assembly including a first filter having a first series inductance connected along a first series path between the first input port and the output port, and a first coupling element positioned physically proximate the first series inductance and extending between a first coupled port and a first isolation port, the first series inductance and the first coupling element being configured to provide at the first coupled port a first coupled signal responsive to receiving a first input signal at the input port, and a second integrated filter and electromagnetic coupler assembly including a second filter having a second series inductance connected along a second series path between the second input port and the output port, and a second coupling element positioned physically proximate the second series inductance and extending between a second coupled port and a second isolation port, the second series inductance and the second coupling element being configured to provide at the second coupled port a second coupled signal responsive to receiving a second input signal at the second input port, the first and second input signals being in different frequency bands.

In one example of the module the first integrated filter and electromagnetic coupler assembly includes a first termination impedance connected to the first isolation port, and the second integrated filter and electromagnetic coupler assembly includes a second termination impedance connected to the second isolation port. At least one of the first and second termination impedances may be adjustable. In another example the first filter includes a first shunt capacitance connected between the first series path and a ground, and a second shunt capacitance connected between the first series path and the ground, the first series inductance being disposed between the first and second shunt capacitances. The first filter may further include an additional series inductance connected along the first series path between the first series inductance and the output port. In another example the second filter includes a first series capacitance connected in parallel with the second series inductance, a second series capacitance connected along the second series path between the second series inductance and the output port, and a first shunt inductance connected between the second series path and the ground, the first shunt inductance being positioned between the first and second series capacitances.

Another embodiment is directed to a wireless device comprising an example of the integrated filter and electromagnetic coupler module; an antenna connected to the output port, a transmitter circuit configured to generate first and second transmit signals of different frequencies, and a power amplifier module connected between the transmitter circuit and the first and second input ports, the power amplifier module configured to receive and amplify the first and second transmit signals to produce the first and second input signals, respectively, and to provide the first and second input signals to the first and second input ports, respectively.

According to another embodiment an integrated filter-coupler module comprises a plurality of input ports and an output port, a plurality of filter sections each including a capacitance and a first series-path inductive element connected along a series path between a corresponding one of the plurality of input ports and the output port, and a corresponding plurality of coupler sections each including a coupled port, an isolation port, a coupling element connected between the coupled port and the isolation port and positioned proximate the first series-path inductive element of an associated one of the plurality of filter sections, and a termination impedance connected to the isolation port, each coupler section of the plurality of coupler sections being configured to provide at the coupled port a coupled signal via inductive coupling between the first series inductance and the coupling element responsive to receiving an input signal at the corresponding one of the plurality of input ports.

Another embodiment is directed to a wireless device comprising an example of the integrated filter coupler module, an antenna connected to the output port, a transmitter circuit configured to generate a corresponding plurality of transmit signals of different frequencies, and a power amplifier module connected between the transmitter circuit and the plurality of input ports, the power amplifier module configured to receive and amplify the plurality of transmit signals to produce, from each transmit signal, the corresponding input signal provided to each of the plurality of input ports.

According to one embodiment a front-end module for a wireless device comprises an integrated filter and electromagnetic coupler assembly having an input port, an output port, a coupled port, and an isolation port, and including a filter having a capacitance and a series inductance, and a coupling element positioned physically proximate the series inductance and extending between the first coupled port and the isolation port, the series inductance being connected between the input port and the output port, and the coupling element and the series inductance being configured to provide a coupled signal at the coupled port in response to an input signal being received at the input port. The front-end module further comprises a power amplifier module coupled to the input port of the integrated filter and electromagnetic coupler assembly and configured to provide the input signal, an antenna coupled to the output port of the integrated filter and electromagnetic coupler assembly.

According to another embodiment a wireless device comprises an integrated filter and electromagnetic coupler assembly having an input port, an output port, a coupled port, and an isolation port, and including a filter having a capacitance and a series inductance, and a coupling element positioned physically proximate the series inductance and extending between the first coupled port and the isolation port, the series inductance being connected between the input port and the output port, and the coupling element and the series inductance being configured to provide a coupled signal at the coupled port in response to an input signal being received at the input port. The wireless device may further include a power amplifier module coupled to the input port of the integrated filter and electromagnetic coupler assembly and configured to provide the input signal. The wireless device may further comprise transceiver coupled to the power amplifier module and configured to provide a transmit signal to the power amplifier module, the power amplifier module being configured to amplify the transmit signal to provide the input signal, an antenna coupled to the output port of the integrated filter and electromagnetic coupler assembly, and a sensor connected to the coupled port of the integrated filter and electromagnetic coupler assembly and configured to detect the coupled signal.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

As discussed above, in communication devices, and particularly in the front-end architecture of the transmit chain in communication devices, it is common to include both a filter and a directional electromagnetic (EM) coupler. Both the filter and the EM coupler contribute to system loss and to the size of implementation. In order to reduce size and reduce loss, aspects and embodiments are directed to combining the filter and EM coupler into an integrated device or module in which certain aspects of the filtering and coupling functionalities are shared by common components.

According to certain embodiments, an integrated filter-coupler can be implemented by recognizing and considering commonality between the components typically used in a filter and those typically included in an EM coupler. As understood by those skilled in the art, during operation of the RF coupler 130, signal power is capacitively or inductively coupled from the main transmission line 210 onto the coupled line 212, such that a coupled signal is provided at the coupled port 206. As discussed above, the coupling factor of the RF coupler 130 defines, in dB, the ratio between the power in the coupled signal at the coupled port 206 and the power in the signal travelling along the main transmission line 210.

Figure 1:
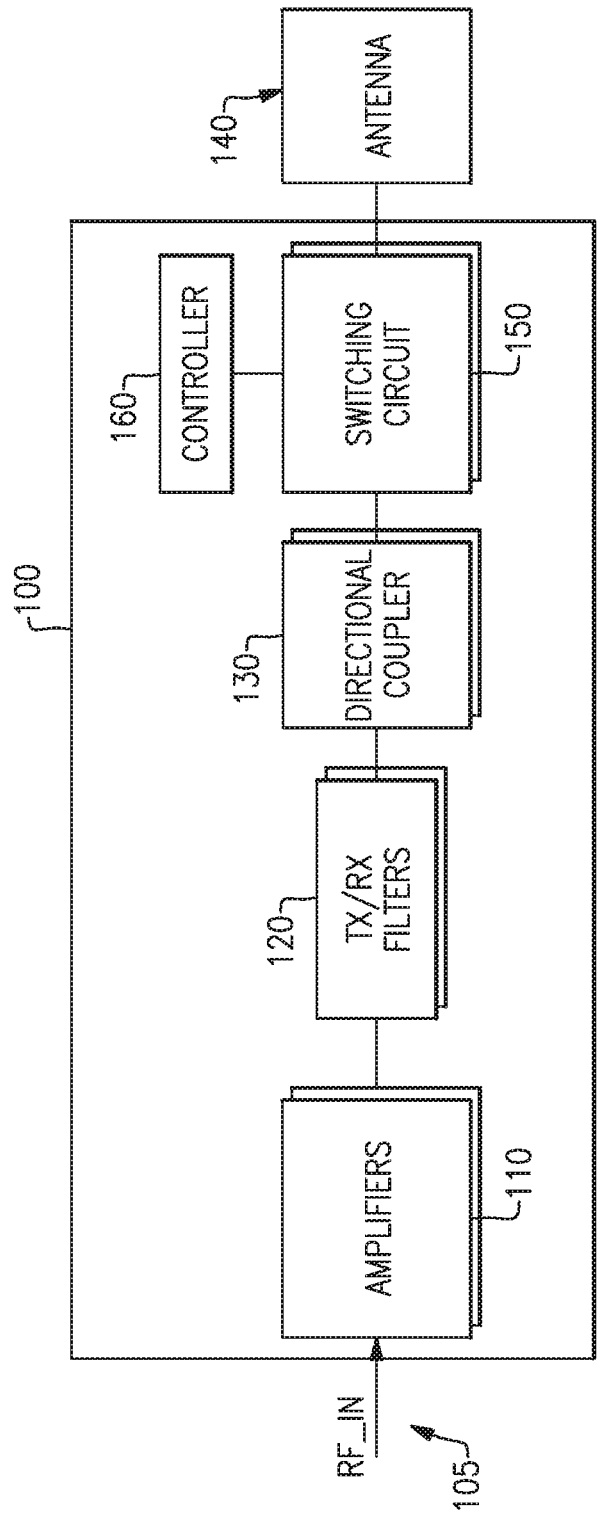
FIG. 1 is a block diagram of one example of a conventional RF front-end system including an individual filter sub-system cascaded with an RF coupler.
Figure 2:
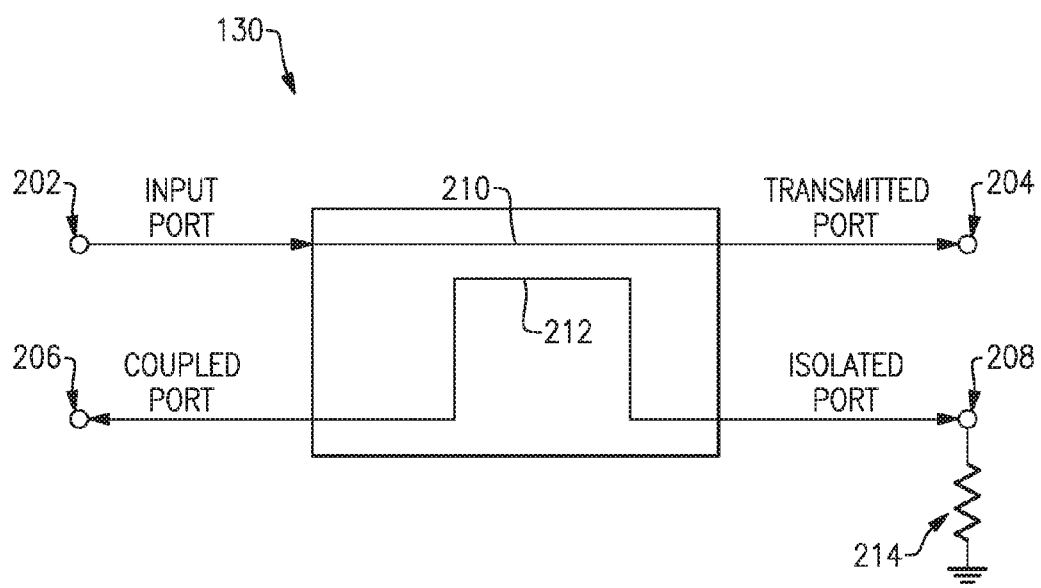
FIG. 2 is a schematic representation of an RF coupler.
Figure 3:
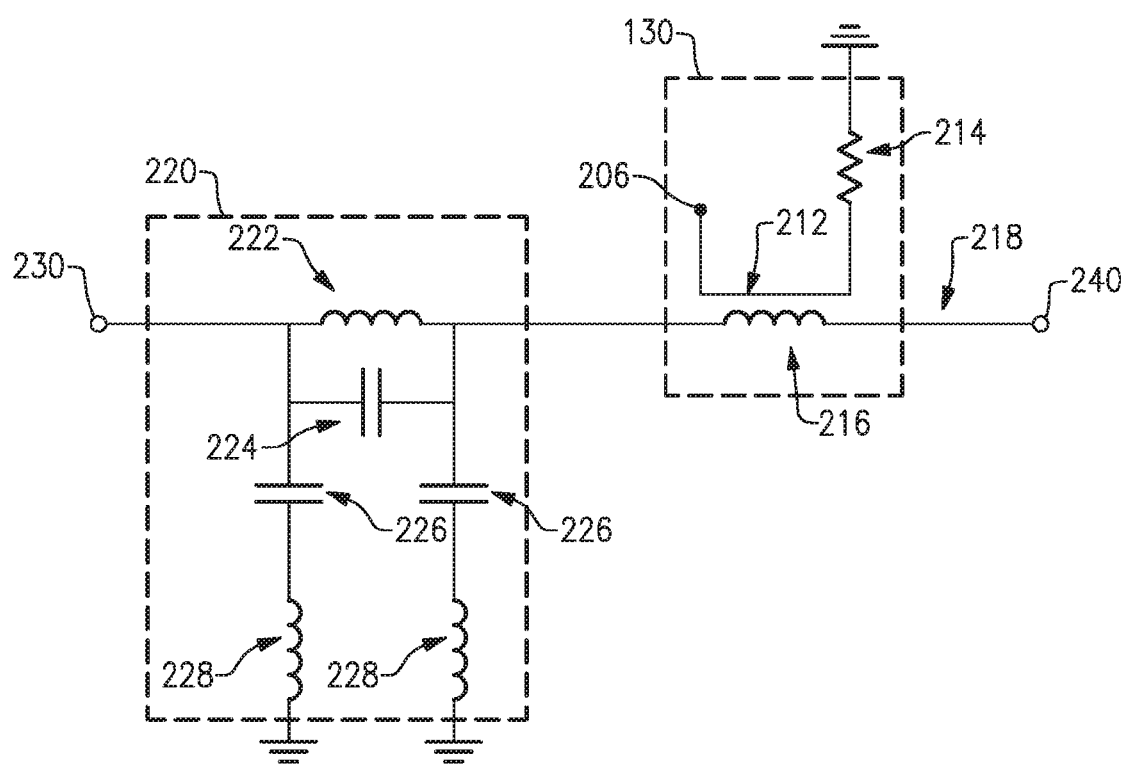
FIG. 3 is a block diagram of an example of a portion of a front-end communications sub-system schematically showing a filter and an electromagnetic coupler represented by capacitive and inductive elements, according to aspects of the present invention.

Due to the nature of the electromagnetic coupling between the main transmission line 210 and the coupled transmission line 212, the main transmission line 210 can be considered as an inductive element 216, as shown in FIG. 3. Thus, referring to FIG. 3, the RF coupler 130 presents a series inductive element 216 along the signal path 218 between a signal input 230 and a signal output 240. Similarly, a filter 220, as may be included in the filter sub-system 120 of FIG. 1, can be connected along the signal path 218. The filter 220 typically includes inductive and capacitive components. The number and arrangement of these components can vary depending on, for example, the shape (e.g., "steepness") or extent (bandwidth) of the desired passband of the filter, and the type of filter being implemented (e.g., lowpass, bandpass, or highpass). In many embodiments, the filter 220 can include a series inductive element connected along the signal path 218. For example, referring to FIG. 3, the filter 220 can be implemented as a "pi" type filter including an inductive element 222 and a capacitive element 224 that form a parallel L-C tank resonator in the signal path 218, and a pair of series L-C tank resonators (each formed of a capacitive element 226 and an inductive element 228) in the shunt path. Similar to the RF coupler 130, the filter 220 in this example includes a series inductive element 222 in the signal path 218 between the signal input 230 and the signal output 240. Thus, the filter 220 includes inductive elements that create electromagnetic fields, which according to certain embodiments, can be detected by a coupled line placed in close proximity. As discussed in more detail below, this commonality between components of the filter 220 and the coupler 130 can be exploited to avoid the need for an individual coupler structure, which reduces system size and loss.

As discussed above with reference to FIG. 1, the RF coupler 130 and the filter 220 (which may be included in the filter sub-system 120) can be connected at various locations along the transmit or receive signal path(s) in a front-end module. Accordingly, referring again to FIG. 3, when the filter 220 and RF coupler 130 are used in the transmit signal path of a front-end module, the signal input 230 may be connected to the output of the power amplifier module 110 or to the switching circuit 150, for example, and correspondingly, the signal output 240 may be connected to the switching circuit 150 or to the antenna 140, for example.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 4A:
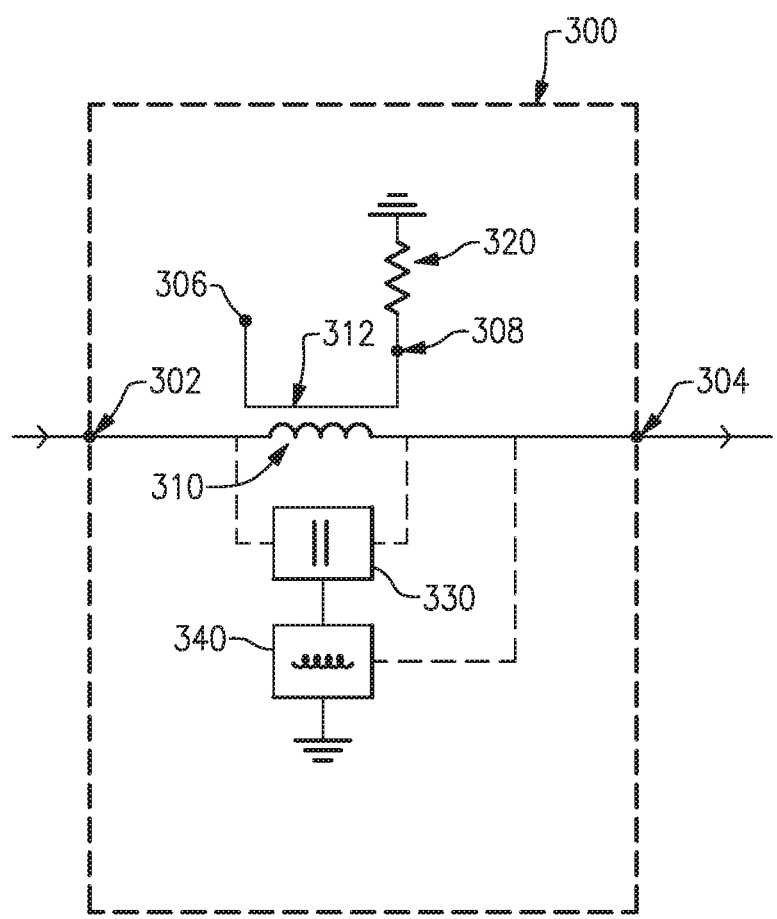
FIG. 4A is a block diagram of one example of an integrated filter-coupler according to aspects of the present invention.

FIG. 4A is a block diagram illustrating an example of an integrated filter-coupler architecture according to certain embodiments. The integrated filter-coupler 300 has an input port 302 and an output port 304, and further has a coupled port 306 and an isolation port 308. When connected in the transmit path of a front-end module (e.g., such as similar to the front-end module 100 shown in FIG. 1), the input port 302 may be connected to the output of the power amplifier module 110 or to the switching circuit 150, for example, and the output port 304 may be connected to the switching circuit 150 or to the antenna 140, for example, depending on the positioning of the integrated filter-coupler 300 within the front-end module. The integrated filter-coupler 300 includes a series inductive element 310 that both provides a filtering component for the filter part of the integrated filter-coupler and acts as the main line of the coupler portion of the integrated filter-coupler. The integrated filter-coupler 300 further includes a coupling element 312 (also referred to herein as a coupled line) positioned in proximity to the inductive element 310 such that a signal travelling along a series signal path between the power amplifier 110 and the antenna 140 can be electromagnetically coupled from the inductive element 310 onto the coupled line 312 and provided to the coupled port 306. The coupling element or coupled line 312 can be a transmission line (which may have any layout, not limited to a straight line), an inductor, or another element that is configured to electromagnetically couple signal power from the series inductive element 310 to provide a coupled signal at the coupled port 306. The isolation port 308 is connected to ground via a termination impedance 320. The integrated filter-coupler 300 further includes a capacitance 330 and an additional inductance 340 that can be configured to provide the desired filtering characteristics (e.g., frequency range of the stopband(s), frequency range of the passband(s), shape of the frequency response, etc.) of the integrated filter-coupler 300. The capacitance 330 and additional inductance 340 may include one or more capacitive and inductive elements, respectively, that are connected in series or parallel, or a combination thereof, with the series inductive element 310. Various examples of configurations of the capacitance 330 and additional inductance 340 are discussed below.

Figure 4B:
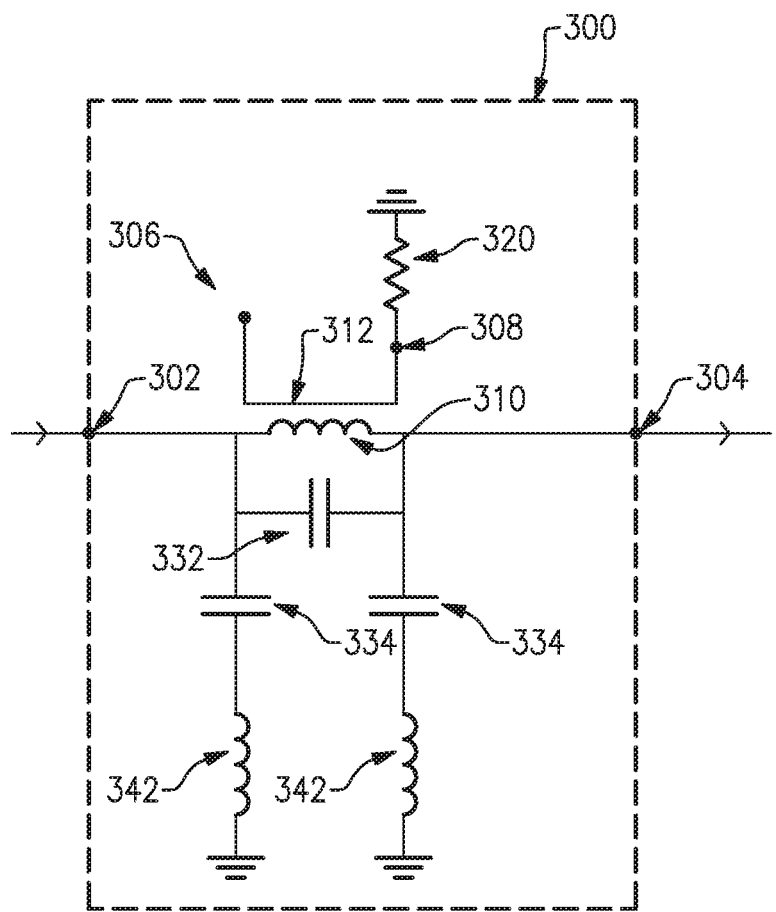
FIG. 4B is a diagram showing an example of the integrated filter-coupler of FIG. 4A in which the integrated filter-coupler has a "pi" type filter structure according to aspects of the present invention.

For example, FIG. 4B illustrates one embodiment in which the integrated filter-coupler 300 has a "pi" type filter structure, similar to the example shown in FIG. 3. Thus, the integrated filter-coupler 300 includes a series-path capacitive element 332 connected in parallel with the series-path inductive element 310, along with two shunt L-C resonant tank circuits each including a capacitive element 334 connected in series with an inductive element 342. Accordingly, in this example, the capacitance 330 of FIG. 4A includes the series-path capacitive element 332 and the two shunt path capacitive elements 334, and the inductance 340 includes the two shunt path inductive elements 342. Although the capacitive elements 332, 334 and the inductive elements 342 are schematically illustrated in FIG. 4B as single lumped elements, those skilled in the art will appreciate, given the benefit of this disclosure, that any of these elements may include one or more lumped or distributed elements, or a combination thereof.

Thus, according to certain embodiments, an integrated filter-coupler 300 is provided that combines both the filter and directional coupler commonly required in a variety of communications front-end sub-systems into a single structure while retaining the functionality of both components. The directional coupler portion of the integrated filter-coupler 300 can be an RF coupler, or can be configured to operate in other frequency bands, such as mm-wave, for example. The filter portion of the integrated filter-coupler 300 can be a highpass, lowpass, or bandpass filter, and may have a variety of configurations, as discussed further below, provided only that at least one series-path inductance is included to act as the main line for the directional coupler. Embodiments and examples of the integrated filter-coupler architectures disclosed herein may have numerous advantages, including reduced overall size compared to individual cascaded filters and couplers with similar performance specifications, reduced insertion loss, and reduced resistive loss through elimination of the dedicated main coupler line required in conventional systems.

Figure 5A:
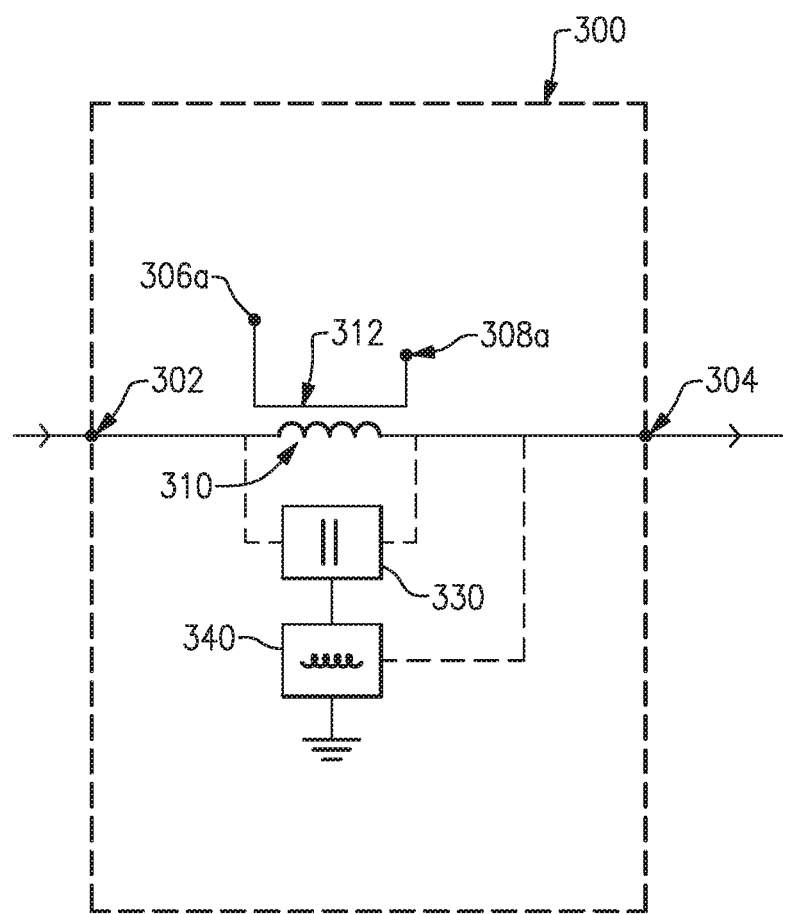
FIG. 5A is a block diagram of one example of the integrated filter-coupler including bi-directional coupler functionality according to aspects of the present invention.
Figure 5B:
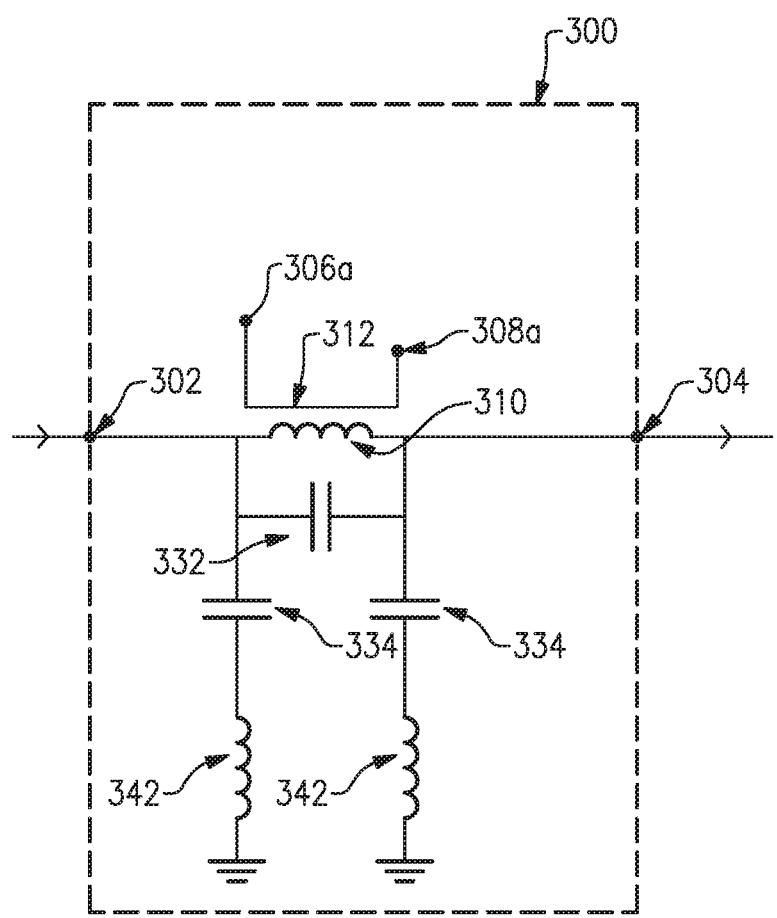
FIG. 5B is a diagram showing an example of the integrated filter-coupler of FIG. 5A in which the integrated filter-coupler has a "pi" type filter structure according to aspects of the present invention.

As will be appreciated by those skilled in the art, given the benefit of this disclosure, the integrated filter-coupler 300 can be configured in a variety of different ways. For example, referring to FIGS. 5A and 5B, in certain embodiments the integrated filter-coupler 300 can include a bi-directional coupler portion. FIG. 5A illustrates a block diagram of one example of the integrated filter-coupler 300 including a bi-directional coupler portion. FIG. 5B illustrates a particular example of the bi-directional integrated filter-coupler 300 of FIG. 5A in which the integrated filter-coupler 300 has a "pi" type filter structure, similar to the example shown in FIG. 4B. In the case of a bi-directional coupler, the coupled line 312 extends between a forward coupled port 306*a* and a reverse coupled port 308*a*. Operating in the forward direction, an indication of forward signal power, for example, traveling from the power amplifier 110 or switching circuit 150 to the antenna 140, is provided at the forward coupled port 306*a*, and operating in the reverse direction, an indication of reverse signal power traveling from the antenna back toward other components in the signal path 218 is provided at the reverse coupled port 308*a*.

As discussed above, typically when the coupler is operating in the forward direction it is desirable to terminate the unused reverse coupled port 308*a* in a matched load or termination impedance, and similarly to terminate the unused forward coupled port 306*a* when the coupler is operating in the reverse direction. Accordingly, referring to FIG. 6A there is illustrated an example of an integrated filter-coupler 300 including a switch network 350 that selectively configures the coupler portion of the integrated filter-coupler 300 for either forward or reverse power measurement. The switch network 350 includes a first switch 352 that selectively connects the forward coupled port 306*a* to either a first measurement port 314 or a first termination impedance 320*a*, and a second switch 354 that selectively connects the reverse coupled port 308*a* to either a second measurement port 316 or a second termination impedance 320*b*. In the example illustrated in FIG. 6A, the integrated filter-coupler 300 is configured for coupler operation in the forward direction (i.e., measurement of the power of a signal traveling toward the antenna 140). Accordingly, the first switch 352 is in the position connecting the forward coupled line port 306*a* to the first measurement port 314, and the second switch 354 is in the position connecting the reverse coupled port 308*a* to the second termination impedance 320*b*. In this arrangement, the reverse coupled port 308*a* acts as the isolation port. The integrated filter-coupler 300 can be reconfigured for reverse operation by actuating the first and second switches 352, 354 to connect the forward coupled port 306*a* to the first termination impedance 320*a* and to connect the reverse coupled port 308*a* to the second measurement port 316. The first and second switches 352, 354 can be "ganged" together or controlled by a single actuation signal to ensure that they are operated together such that at any given time one of the forward coupled port 306*a* and the reverse coupled port 308*a* is connected to a measurement port and the other is connected to a termination impedance 320.

Figure 6A:
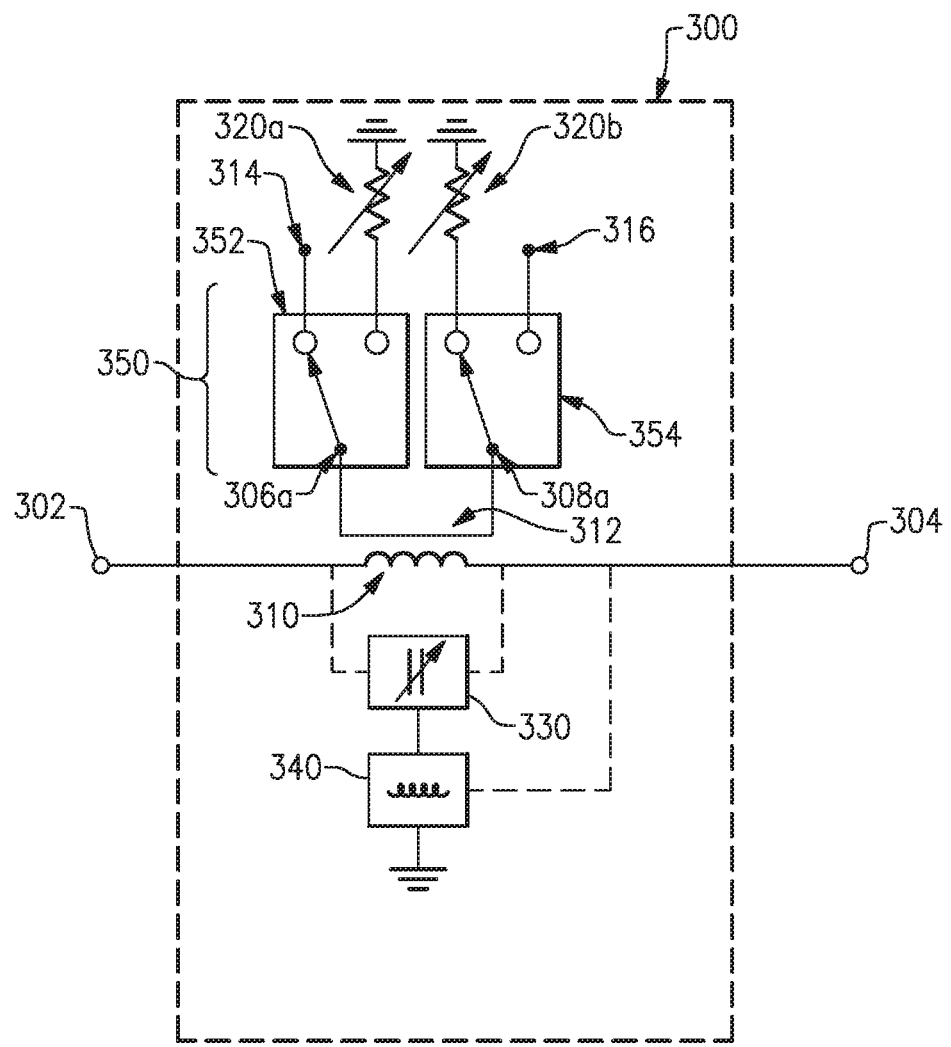
FIG. 6A is a block diagram of another example of the integrated filter-coupler including bi-directional coupler functionality and adjustable coupler termination impedances and filter components according to aspects of the present invention.
Figure 6B:
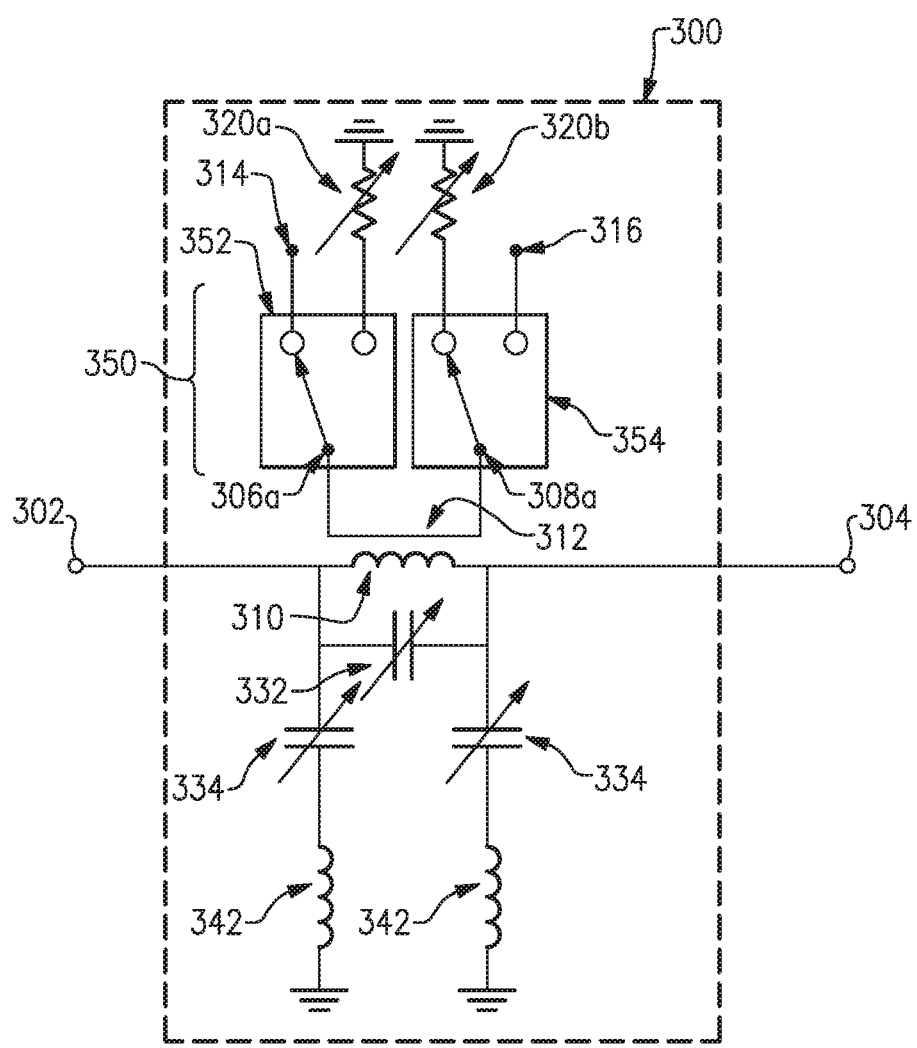
FIG. 6B is a diagram showing an example of the integrated filter-coupler of FIG. 6A in which the integrated filter-coupler has a "pi" type filter structure according to aspects of the present invention.

FIG. 6B illustrates an example of the integrated filter-coupler 300 shown in FIG. 6A in which the integrated filter-coupler 300 has a "pi" type filter structure.

Figure 6C:
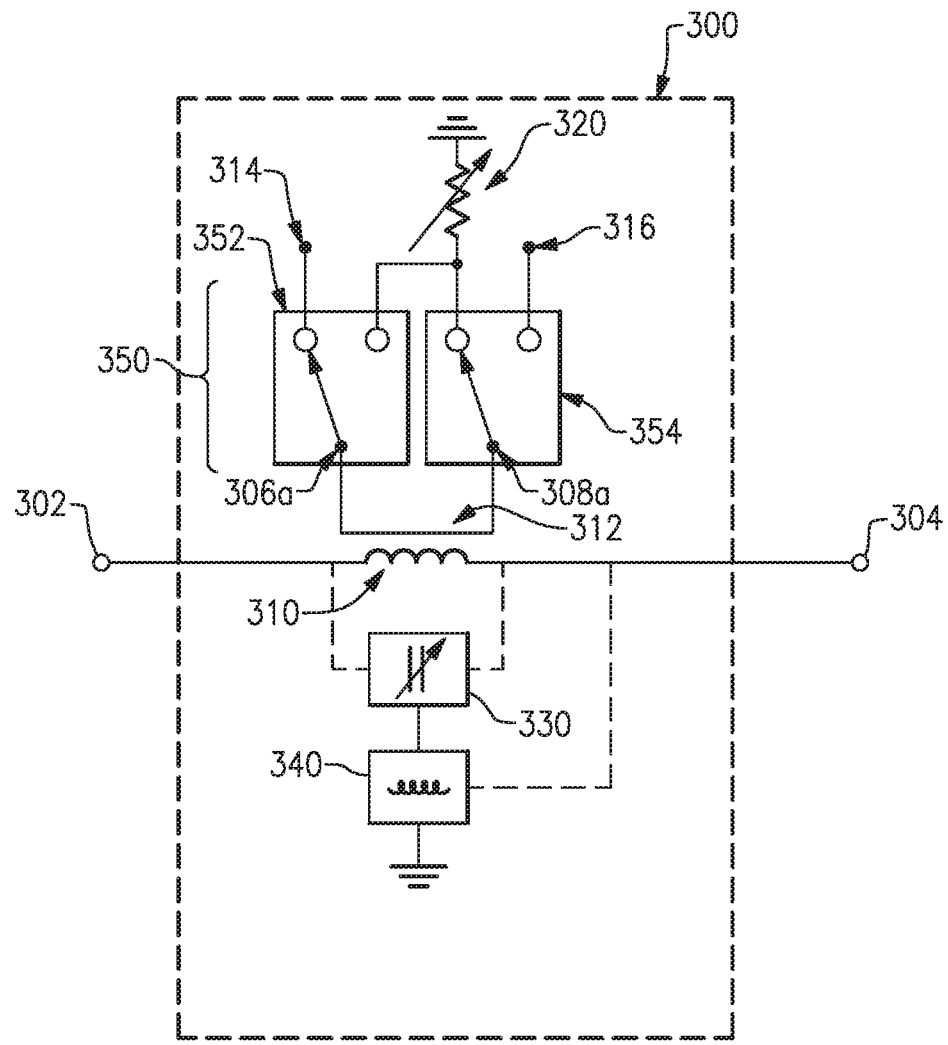
FIG. 6C is a block diagram of another example of the integrated filter-coupler including bi-directional coupler functionality and adjustable coupler termination impedances and filter components according to aspects of the present invention.
Figure 6D:
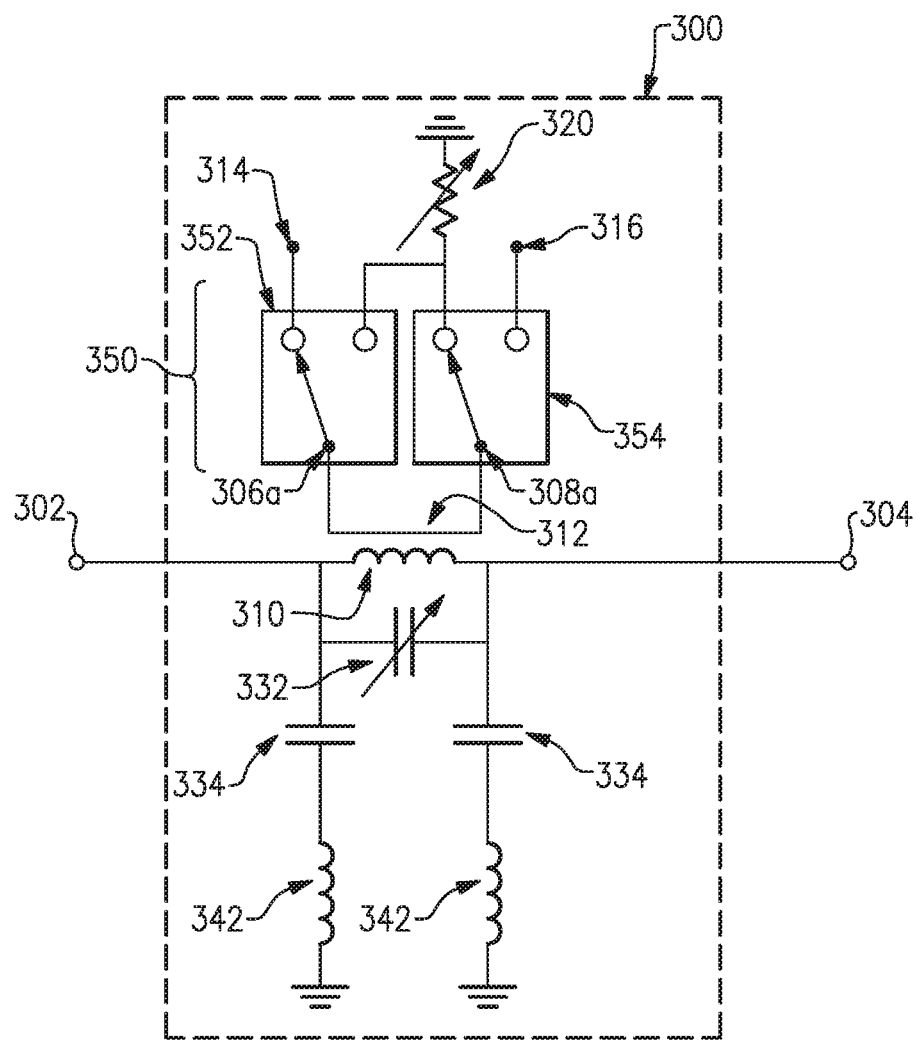
FIG. 6D is a diagram showing an example of the integrated filter-coupler of FIG. 6C in which the integrated filter-coupler has a "pi" type filter structure according to aspects of the present invention.

In the examples illustrated in FIGS. 6A and 6B, the first and second switches 352, 354 are shown as single-throw-double-pole switches. However, those skilled in the art will appreciate that the switch network 350 can have a variety of other configurations, along with various other arrangements of the measurement ports 314, 316 and the termination impedance(s) 320. For example, the measurement ports 314, 316 can be implemented as a single physical port that can be selectively connected to either the forward coupled port 306*a* or the reverse coupled port 308*a* by one or more switches. Similarly, rather than using individual termination impedances 320*a* and 320*b*, a single termination impedance 320 can be used that is selectively connected to either the forward coupled port 306*a* or the reverse coupled port 308*a* by one or more switches, as shown in FIGS. 6C and 6D, for example.

In certain examples the termination impedance(s) 320 can be matched 50 Ohm loads, which can be implemented using one or more resistors, optionally in combination with one or more inductive or capacitive elements. In certain embodiments and applications it may be desirable to have operation of the integrated filter-coupler 300 at different frequencies or in different frequency bands. Accordingly, in certain embodiments, the termination impedances 320 can be adjustable, as shown in FIGS. 6A-D. Adjustable termination impedances can be implemented using one or more variable or tunable resistive, inductive, or capacitive elements, or a combination thereof, or by using switchable elements. Examples of adjustable termination impedances which may be used for the termination impedances 320 are described in commonly-owned U.S. application Ser. Nos. 14/745,210 and 15/260,544.

Figure 7A:
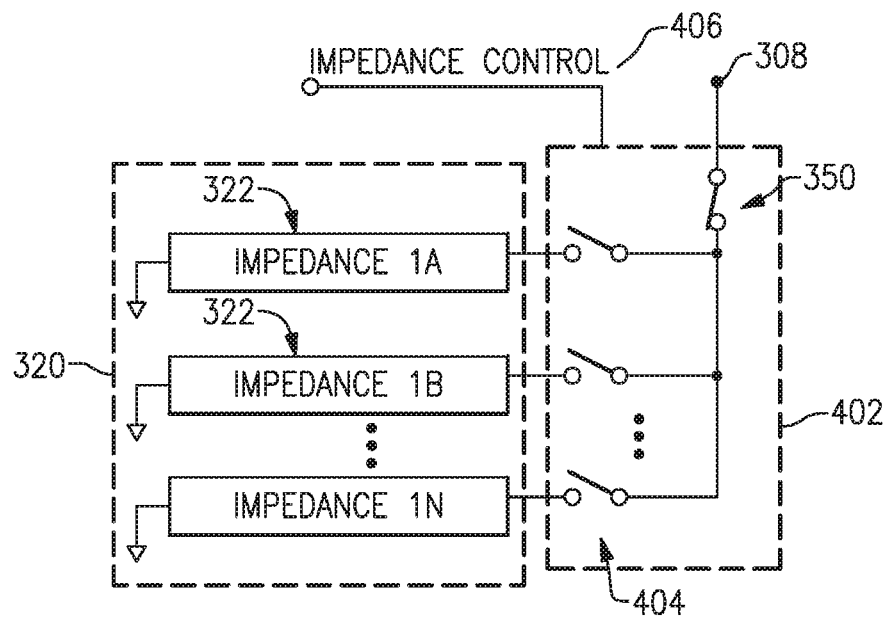
FIG. 7A is a block diagram of one example of an adjustable termination impedance that can be used in the integrated filter-coupler according to aspects of the present invention.

For example, referring to FIG. 7A, in certain embodiments, a switch network 402 can selectively electrically couple different termination impedances 322 to the isolation port 308 responsive to an impedance control signal 406. The switch network 402 can include the "mode select" switch 350 that selectively connects the isolation port 308 to the adjustable impedance 320 and is used to configure the integrated filter-coupler 300 between forward and reverse power detection modes, for example. In the example illustrated in FIG. 7A, the adjustable termination impedance 320 includes a plurality of impedances 322 and a corresponding plurality of switches 404, each operable to electrically connect a respective one of the impedances 322 to the isolation port 308 of the integrated filter-coupler 300. Responsive to one or more impedance control signals 406, any one or more of the switches 404 can be closed to electrically connect any combination of one or more of the impedances 322 to the isolation port 308, thereby presenting a desired impedance value at the isolation port. Each of the impedances 322 can include one or more fixed resistive, capacitive, or inductive elements, or any combination thereof.

Figure 7B:
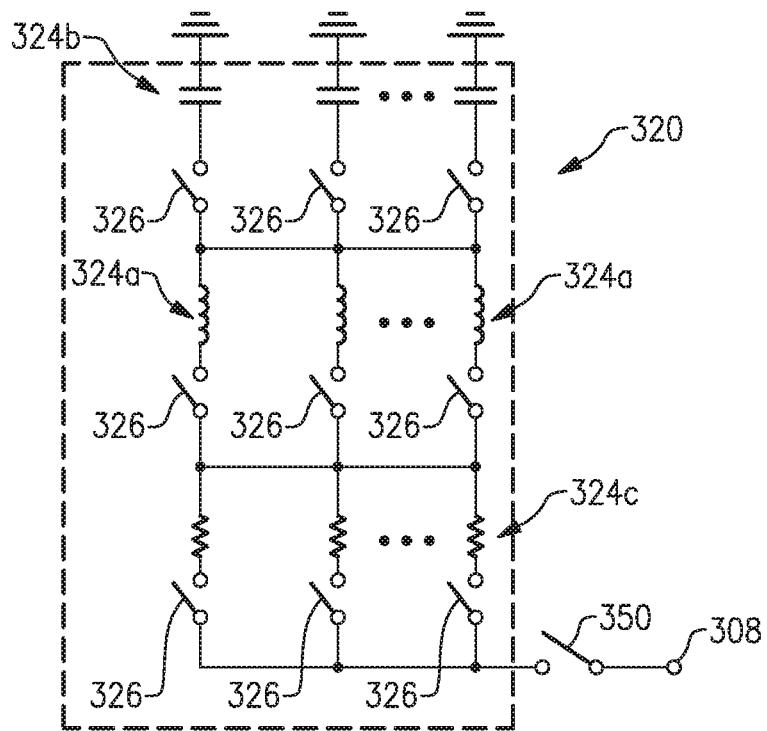
FIG. 7B is a circuit diagram of another example of an adjustable termination impedance that can be used in the integrated filter-coupler according to aspects of the present invention.
Figure 7C:
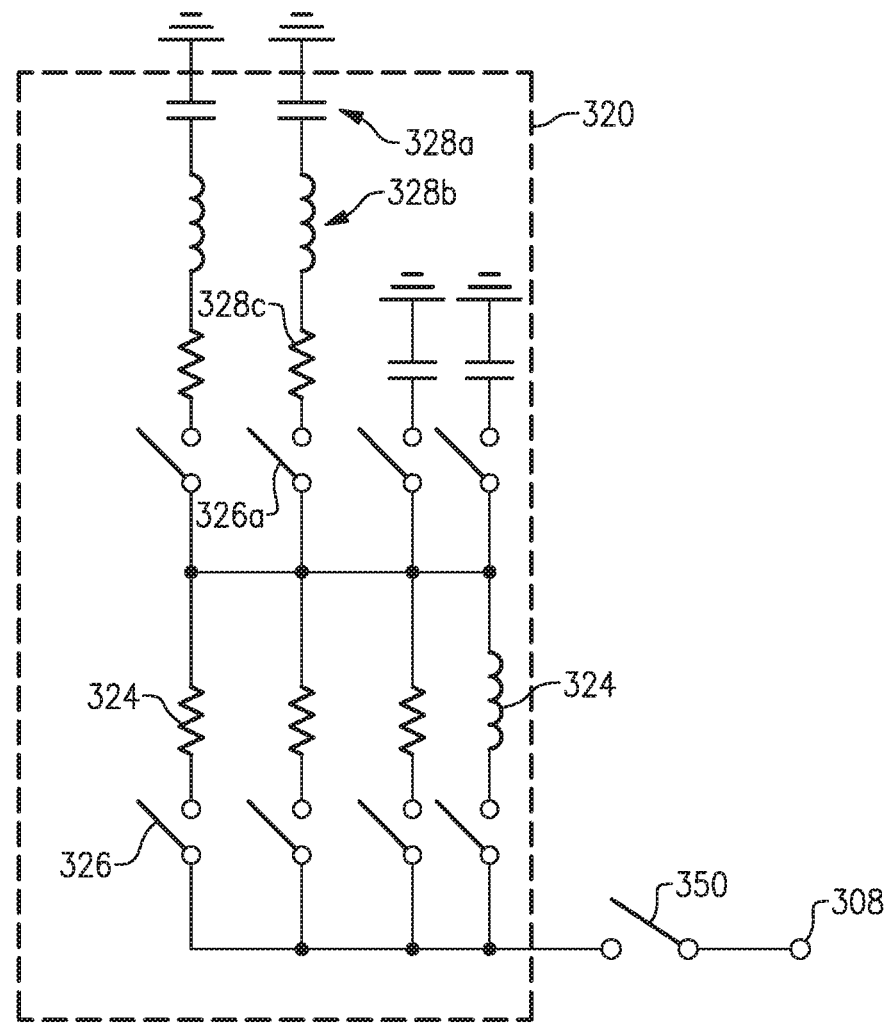
FIG. 7C is a circuit diagram of another example of an adjustable termination impedance that can be used in the integrated filter-coupler according to aspects of the present invention.

In the example shown in FIG. 7A, the switches 404 are positioned between the isolation port 308 of the integrated filter-coupler 300 and each of the impedances 322. FIG. 7B illustrates another configuration, in which the adjustable termination impedance 320 includes a network of individually switchable impedance elements 324 (including inductive 324*a*, capacitive 324*b*, and resistive 324*c* elements), each having an associated switch 326. FIG. 7C illustrates another example in which some impedance elements are grouped (e.g., elements 328*a*, 328*b*, and 328*c*) and associated with a single impedance switch 326*a*, rather than every impedance element being individually switched, as shown in FIG. 7B. Although the switchable impedance elements 324, 328 are shown in FIGS. 7B and 7C as fixed resistive, capacitive, and inductive elements, any one or more of the impedance elements may be tunable as well as switchable.

Using an adjustable termination impedance 320 can improve the directivity of the integrated filter-coupler 300 across multiple frequency bands as the termination impedance can be optimized for different frequencies.

Referring again to FIGS. 6A-D, in certain embodiments one or more of the filter components of the integrated filter-coupler 300 can also be adjustable or tunable. In the example shown in FIGS. 6A and 6C, the capacitance 330 is implemented using one or more variable capacitive elements to provide a variable or adjustable capacitance 330. For example, as shown in FIGS. 6B and 6D any or all of the capacitive elements 332 and 334 can be adjustable. In some instances, using the series-path inductive element 310 as both a filtering component and the main line of the coupler portion of the integrated filter-coupler 300 can cause a slight shift or change in the desired characteristics of the filter portion of the integrated filter-coupler 300. Accordingly, having one or more of the other filter components be adjustable, such as by using an adjustable capacitance 330, allows a user/designer flexibility to tune the integrated filter-coupler 300 to achieve both a desired coupling factor and desired filter characteristics.

Figure 8:
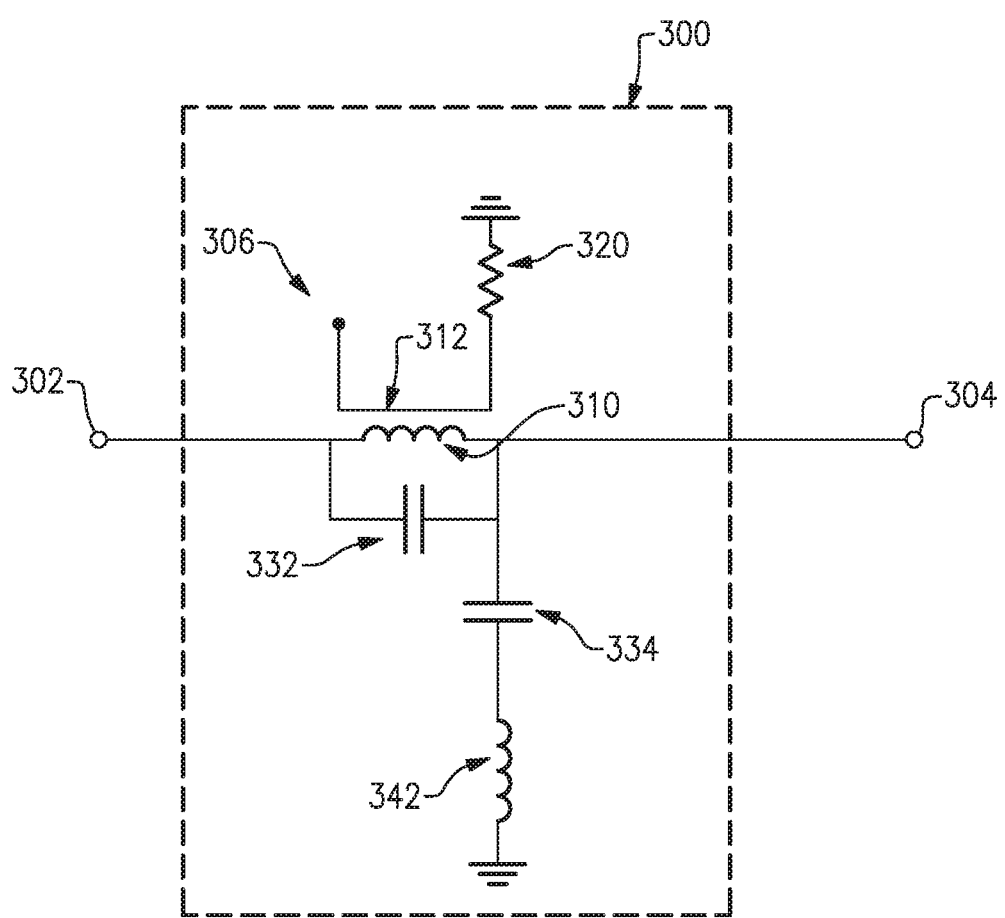
FIG. 8 is a block diagram of another example of the integrated filter-coupler according to aspects of the present invention.

As discussed above, the filter portion of the integrated filter-coupler 300 can have a variety of different forms and implementations. FIGS. 4B, 5B, 6B, and 6D illustrate examples in which the integrated filter-coupler 300 has a "pi" type filter structure. However, other implementations can include other filter structures. For example, FIG. 8 illustrates another embodiment of an integrated filter-coupler 300 that includes an L-network type of filter. In this example the integrated filter-coupler 300 includes a series-path capacitive element 332 connected in parallel with the series-path inductive element 310, along with a shunt L-C resonant arm including a capacitive element 334 connected in series with an inductive element 342.

Figure 9A:
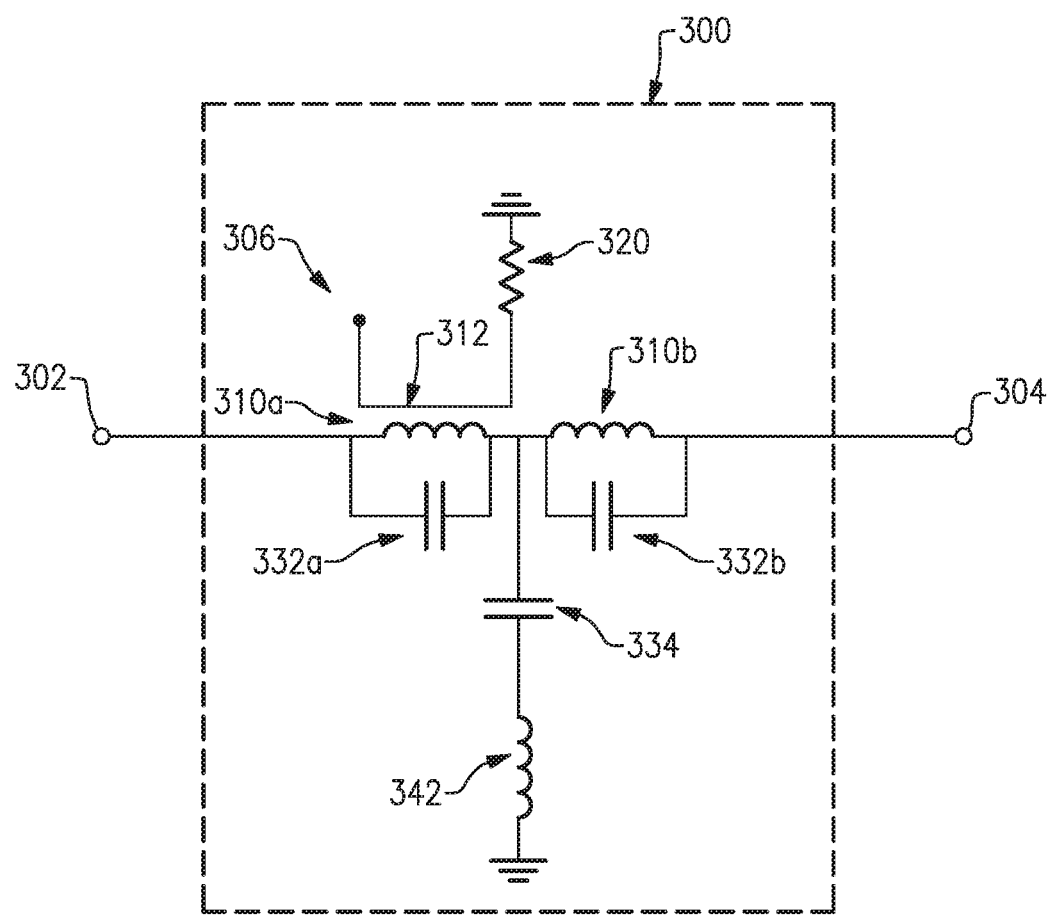
FIG. 9A is a block diagram of another example of the integrated filter-coupler according to aspects of the present invention.

According to certain embodiments, the integrated filter-coupler 300 may include one or more series-path inductive elements 310 associated with one or more filter sections, and the coupler portion can be located in any one or more of the filter sections. For example, FIG. 9A illustrates an example in which the integrated filter-coupler 300 includes a T-network type of filter. In this example the integrated filter-coupler 300 includes a pair of series-path LC resonant tank circuits, each formed of a series-path inductive element 310a or 310b connected in parallel with a series-path capacitive element 332a or 332b, respectively, as shown. The integrated filter coupler 300 further includes a shunt L-C resonant arm including a capacitive element 334 connected in series with an inductive element 342, the shunt LC resonant arm being positioned between the two series-path resonant tank circuits. In the example illustrated in FIG. 9A, the coupled line 312 is positioned proximate the series-path inductive element 310a of the first series-path resonant tank circuit of the filter section; however, as will be appreciated by those skilled in the art, an alternate arrangement in which the coupler portion is associated with the second series-path resonant tank circuit can also be implemented. In such an example, the coupled line 312 would be positioned proximate the series-path inductive element 310b.

Figure 9B:
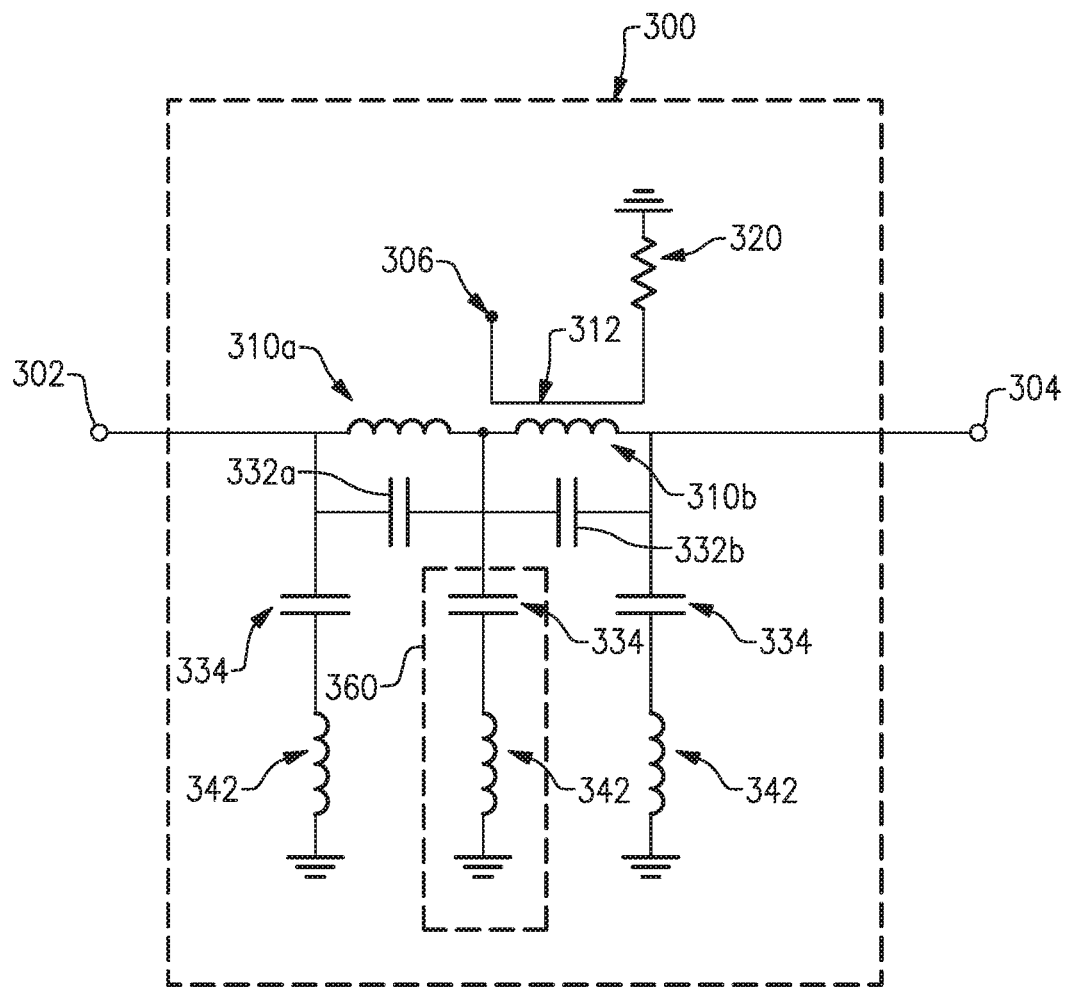
FIG. 9B is a block diagram of another example of the integrated filter-coupler according to aspects of the present invention.

FIG. 9B illustrates another example in which the integrated filter-coupler 300 includes two pi-type filter sections sharing a common central shunt arm 360. In the illustrated example the coupler portion is associated with the second filter section. In particular, as shown, the coupled line 312 is positioned proximate the series-path inductive element 310b of the second filter section. However, as will be appreciated by those skilled in the art, an alternate arrangement in which the coupler portion is associated with the first filter section, rather than the second, can also be implemented. In such an example, the coupled line 312 would be positioned proximate the series-path inductive element 310a of the first filter section. This concept can be readily extended to multiple filter sections, and a wide variety of different filter configurations, as will be appreciated by those skilled in the art, given the benefit of this disclosure.

Figure 10A:
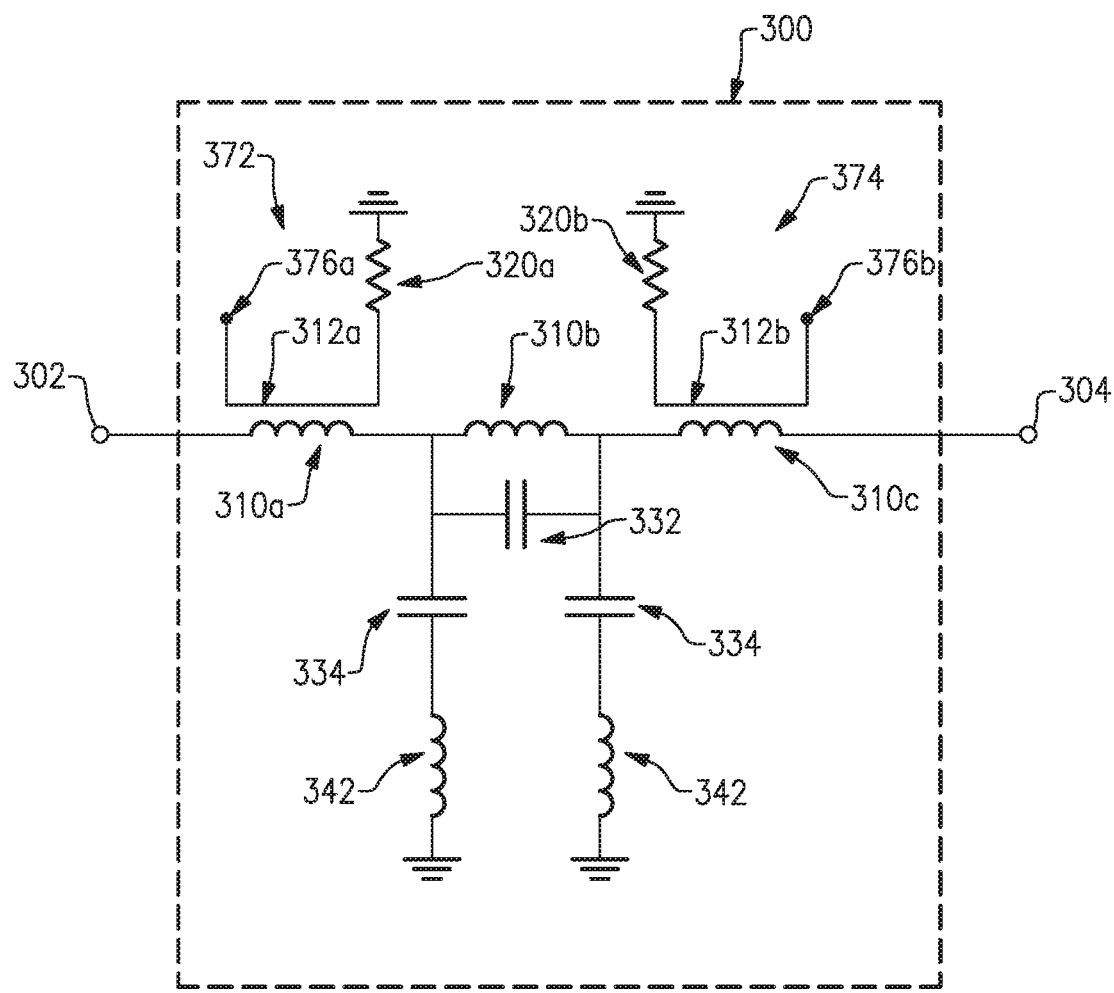
FIG. 10A is a block diagram of another example of the integrated filter-coupler including multiple coupler sections according to aspects of the present invention.

FIG. 10A illustrates another example in which the integrated filter-coupler 300 includes multiple series-path inductive elements 310a, 310b, 310c. This arrangement can implement a five-pole lowpass filter, for example. As discussed above, the coupler functionality can be integrated with any one or more of the series-path inductive elements 310a, 310b, 310c. In the example illustrated in FIG. 10A, the integrated filter-coupler 300 includes a first coupler section 372 and a second coupler section 374. The first coupler section 372 includes a first coupled line 312a positioned proximate the first series-path inductive element 310a, and the second coupler section 374 includes a second coupled line 312b positioned proximate the third series-path inductive element 310c. In the illustrated example, the integrated filter-coupler 300 can configured for simultaneous forward and reverse power detection. For example, the first coupler section 372 can operate in the forward direction to provide an indication of forward power at a first coupled port 376a, with the isolation port of the first coupler section being connected to a first termination impedance 320a; whereas the second coupler section 374 can simultaneously operate in the reverse direction to provide an indication of reverse power at a second coupled port 376b, with the isolation port of the second coupler section being connected to a second termination impedance 320b.

Figure 10B:
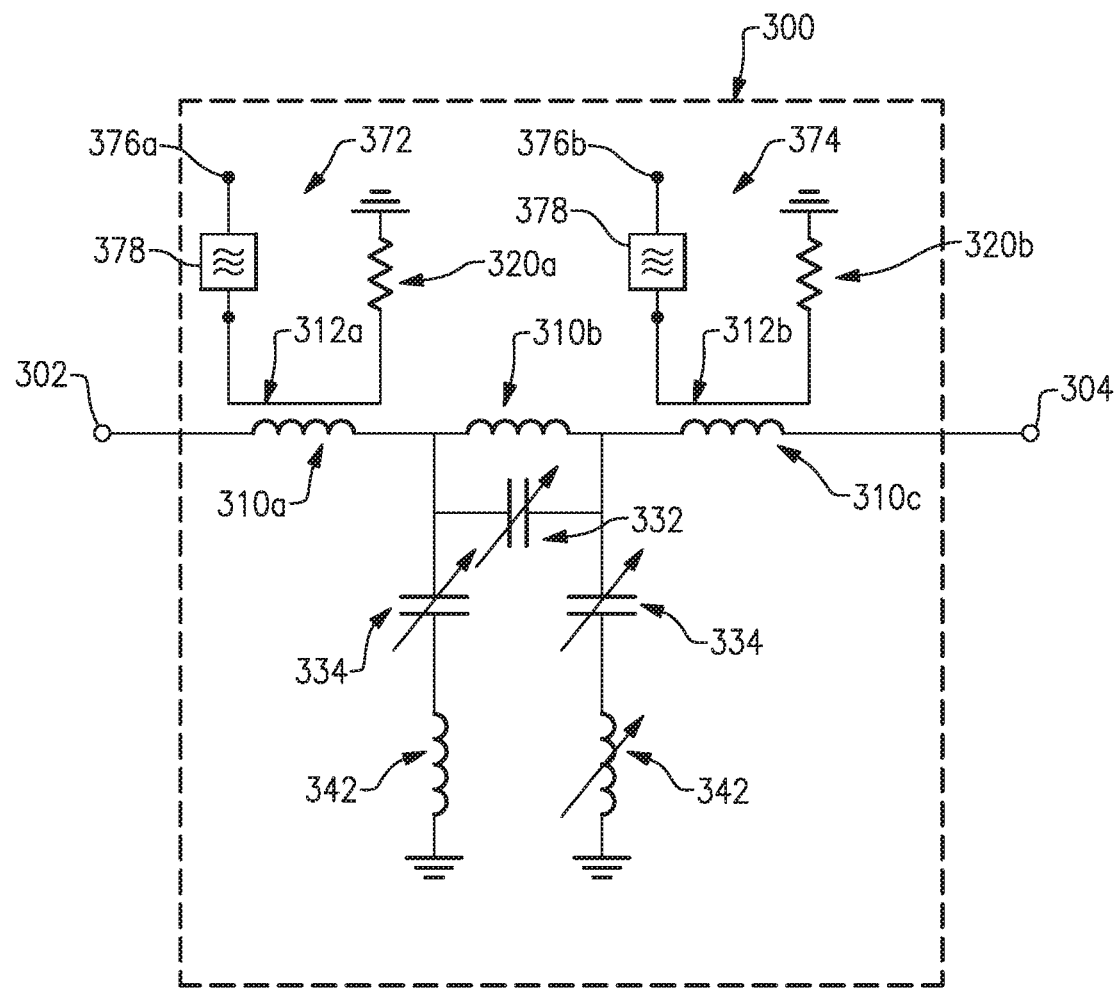
FIG. 10B is a block diagram of another example of the integrated filter-coupler including multiple coupler sections and frequency selective components according to aspects of the present invention.

Referring to FIG. 10B, in another example the first and second coupler sections 372 and 374 can be configured for simultaneous power detection in different frequency bands. For example, where the input signal received at the input port 302 includes carriers in multiple frequency bands, the first coupler section 372 can be configured for power detection in a first frequency band, and the second coupler section 374 can be configured for power detection in a second frequency band. One or both of the first and second coupler sections 372, 374 may include frequency selective components 378 (e.g., bandpass filters) in the coupled paths to prevent signals in the other frequency band(s) from interfering with power detection in the particular frequency band of interest for each coupler section.

Although the examples shown in FIGS. 10A and 10B illustrate the first and second coupler sections 372 and 374 associated with the first and third series-path inductive elements 310a and 310c, respectively, those skilled in the art will appreciate that the coupler sections may instead be associated with the first and second or second and third series-path inductive elements, or with additional series-path inductive elements not shown in FIGS. 10A and 10B.

Figure 11:
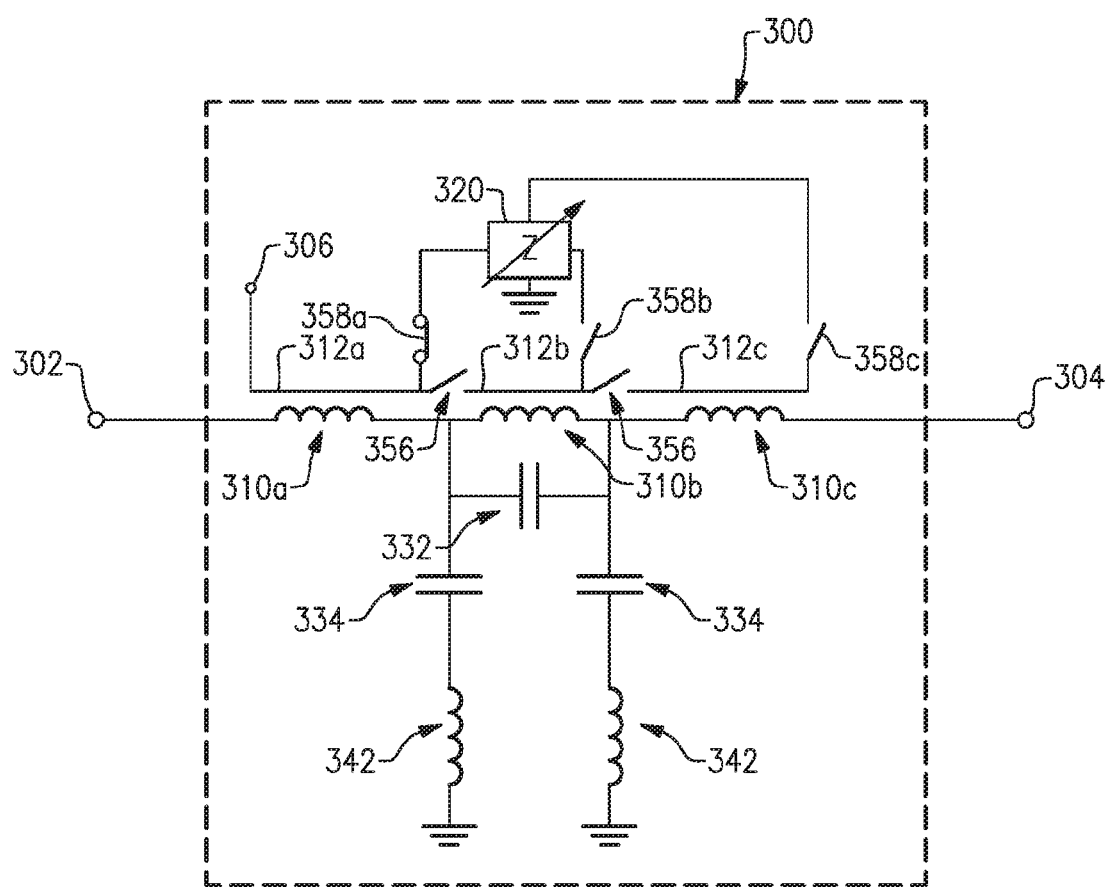
FIG. 11 is a block diagram of another example of the integrated filter-coupler including multiple coupler sections according to aspects of the present invention.

In other examples, multiple coupler sections can be coupled together, for example using one or more switches, to provide additional flexibility and functionality. For example, referring to FIG. 11, series switches 356 can be used to selectively couple together multiple coupled line sections 312a, 312b, and 312c. If both series switches 356 are open, the coupler functionality can be provided by coupled line section 312a, and switch 358a can be closed to connect the isolation port 308 to the termination impedance 320, as discussed above. This is the configuration illustrated in FIG. 11. If the first series switch 356 is closed, the switch 358a can be opened, and switch 358b closed to connect the termination impedance 320 to the isolation port at the end of the combination of the first and second coupled line sections 312a and 312b. Similarly, if both series switches 356 are closed, switches 358a and 358b can be opened and switch 358c closed to connect the termination impedance 320 to the isolation port at the end of the combination of all three coupled line sections 312a, 312b, and 312c. As discussed above, the termination impedance 320 can be adjustable so as to allow its value to be optimized depending on, for example, the number of coupled line sections connected together or the frequency of operation. Furthermore, in the example the illustrated in FIG. 11, the isolation port ends of each of the coupled line sections 312a, 312b, and 312c are shown selectively connected to one common termination impedance 320; however, individual termination impedances can be used instead. In addition, although three coupled line sections are shown in FIG. 11, those skilled in the art will appreciate that the concept can be implemented using only two coupled line sections, or can be readily extended to four or more coupled line sections, each associated with at least one series inductive element 310.

Thus, various aspects and embodiments provide an integrated filter-coupler 300 that can include one or more filter sections and one or more coupler sections. The coupler functionality can be combined with any one or more of the filter sections, in a variety of different configurations, some examples of which are discussed above. Those skilled in the art will appreciate, given the benefit of this disclosure, that the examples disclosed herein are illustrative only and not intended to be limiting.

Figure 12:
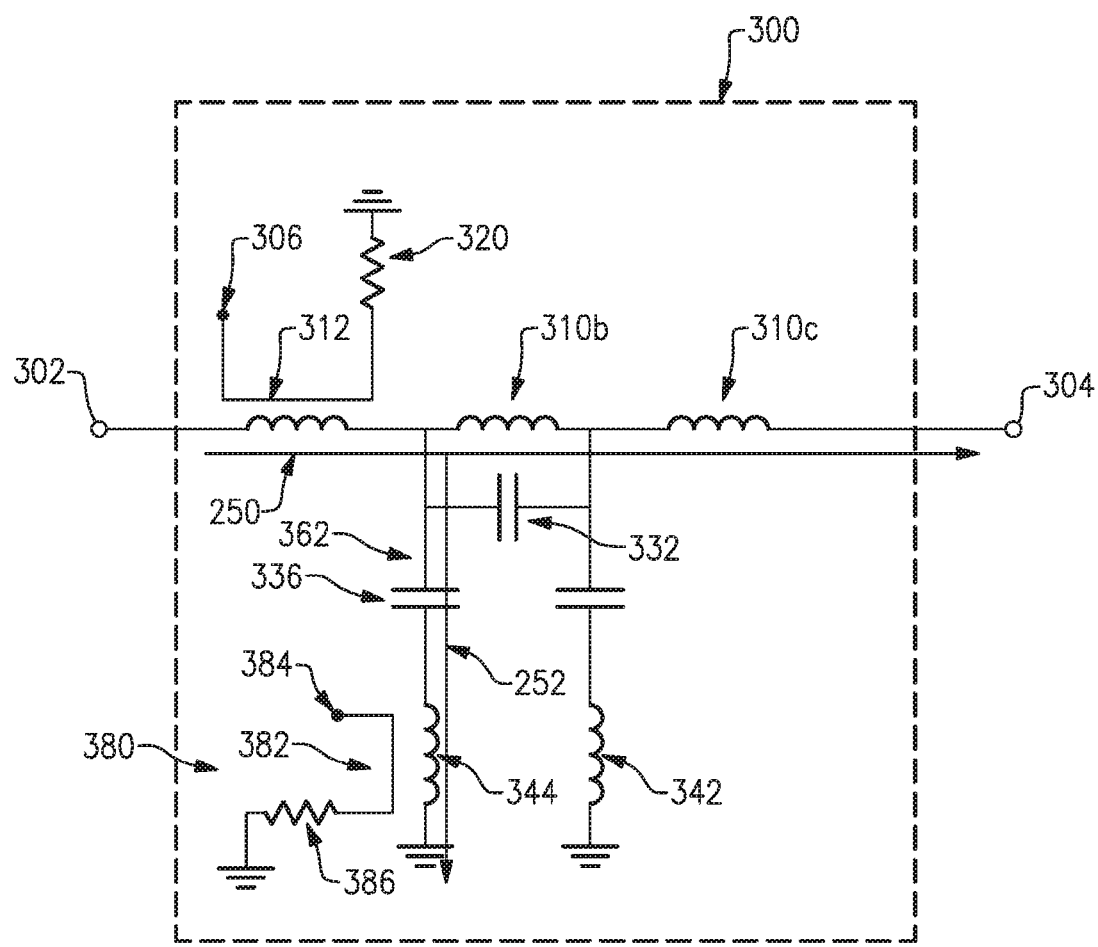
FIG. 12 is a block diagram of another example of the integrated filter-coupler including harmonic frequency detection capability according to aspects of the present invention.

Referring to FIG. 12, in certain circumstances when a transmission signal 250 is travelling through the integrated filter-coupler 300 from the input node 302 to the output node 304, a harmonic signal 252 can be generated in the shunt arms of the filter portion of the integrated filter-coupler. In particular, filters with shunt inductors 342 or 344 may form "traps" for harmonic frequencies. If the transmission signal 250 has a fundamental frequency F1, a harmonic signal 252 of particular interest can be the third harmonic or third intermodulation product having a frequency F3. In certain applications it can be desirable to measure the power level of the third harmonic signal 252. Accordingly, as shown in FIG. 12, an additional coupler section 380 can be integrated with one of the shunt arms 362 that includes a capacitive element 336 and an inductive element 344. The coupled line 382 of the additional coupler section 380 can be placed in proximity to the shunt inductive element 344. The additional coupler section 380 can operate in a manner similar to the above-described coupler sections, and couple a portion of the power in the harmonic signal 252 into the coupled line 382 to be output for detection/measurement at a coupled port 384. The isolation port of the additional coupler section 380 can be terminated in a termination impedance 386, which can be adjustable, as discussed above. The inductive element 344 and capacitive element 336 of the shunt arm 362 can be tuned to pass the harmonic signal 252 of interest (e.g., the third harmonic, as discussed above).

Figure 13:
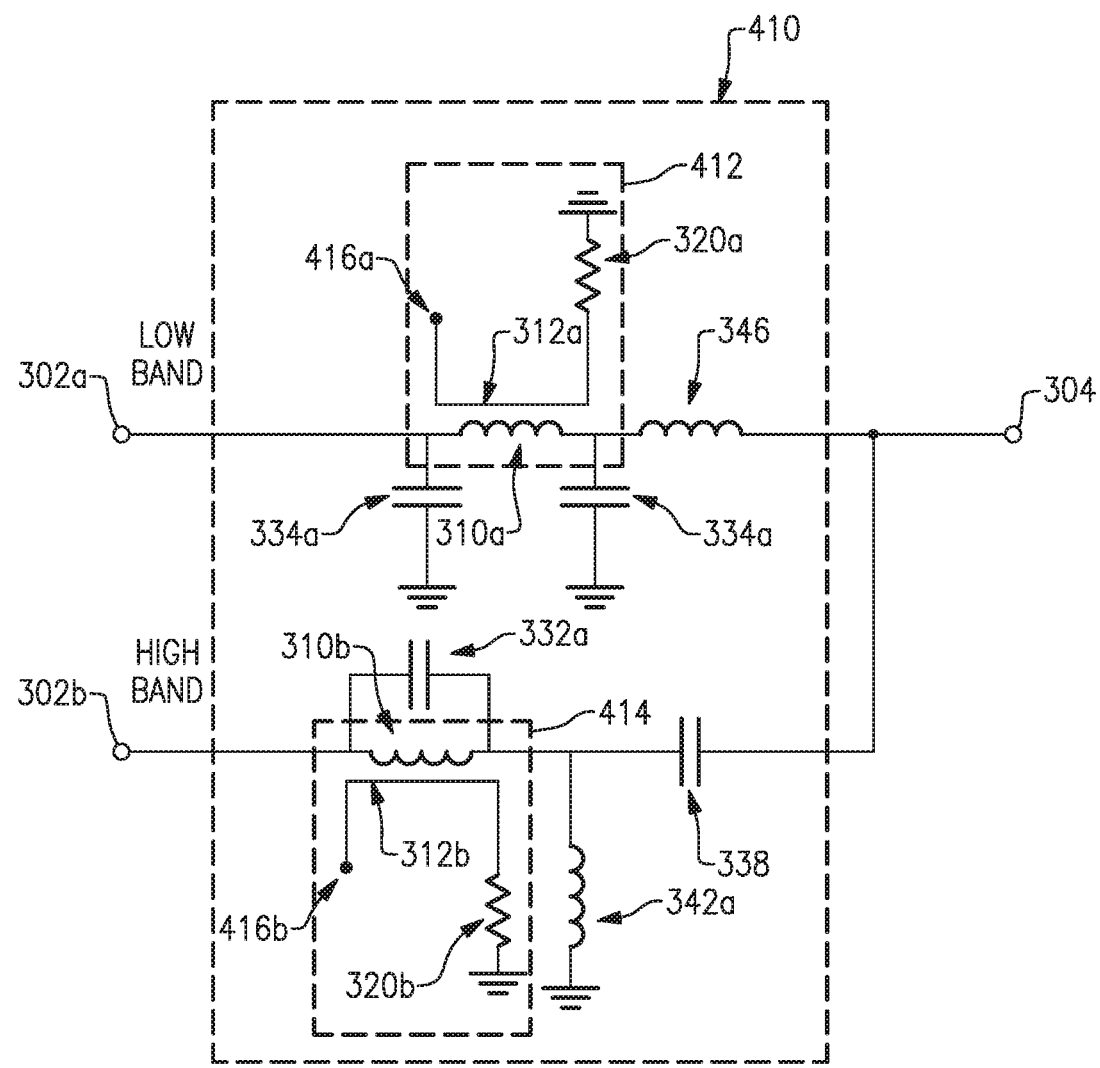
FIG. 13 is a block diagram of one example of a multi-frequency integrated filter-coupler module according to aspects of the present invention.

According to another embodiment, the filter portion of the integrated filter-coupler may be part of a multiplexer, such as a diplexer, triplexer, quadplexer, or higher-order multiplexer, and it may be desirable to couple and measure multiple frequencies simultaneously. FIG. 13 illustrates one embodiment of an integrated filter-coupler module 410 for use in a diplexer, for example. In the illustrated example, the filter portions of the integrated-filter coupler module 410 act as a diplexer configured to direct both a low-band signal from a low-band input 302a and a high-band signal from a high-band input 302b to the output 304. As will be appreciated by those skilled in the art, given the benefit of this disclosure, the high-band and low-band inputs 302a, 302b may be connected to power amplifiers that can be part of the same power amplifier module 110 or may be separate power amplifier modules, or may be connected to a switching module 150 that is configured to direct both the high-band and low-band signals to the integrated filter-coupler module 410. To couple and measure both the low-band signal and the high-band signal simultaneously, the integrated filter-coupler module 410 includes a first coupler section 412 (including a first coupled line 312a, a first coupled port 416a and a first termination impedance 320a) associated with a low-band filter section and a second coupler section 414 (including a second coupled line 312b, a second coupled port 416b and a second termination impedance 320b) associated with a high-band filter section. In the illustrated example the low-band filter section includes a ladder-type filter network, including a first series-path inductive element 310a, a pair of shunt capacitive elements 334, and a second series-path inductive element 346. The first coupled line 312a of the first coupler section 412 is positioned proximate the first series-path inductive element 310a and is configured to couple the low-band signal to provide at the first coupled port 416a an indication of the signal power of the low-band signal, as discussed above. In other examples the first coupled line 312a can be positioned proximate the second series-path inductive element 346.

Still referring to FIG. 13, in the illustrated example the high-band filter section includes a T-type filter network, including a series-path LC resonant tank circuit formed of a series-path inductive element 310b and a first series path capacitive element 332a connected in parallel with the series-path inductive element 310b, a second series-path capacitive element 338, and a shunt inductive element 342a connected to the series signal path between the first and second series-path capacitive elements 332a, 338. The second coupled line 312b of the second coupler section 414 is positioned proximate the series-path inductive element 310b and is configured to couple the high-band signal to provide at the second coupled port 416b an indication of the signal power of the high-band signal, as discussed above.

As will be appreciated by those skilled in the art, given the benefit of this disclosure, numerous variations of the integrated filter-coupler module 410 may be implemented. For example, the integrated filter-coupler module 410 may be a single integrated module, or may be formed of two separate filter-couplers 300. Each of the low-band and high-band filter sections may have a variety of other configurations, not limited to the examples shown in FIG. 13, and may include the same or different filter types. Either or both of the termination impedances 320a and 320b may be adjustable termination impedances, as discussed above, and may be selected to optimize coupler directivity or other performance characteristics for the low-band and high-band frequencies, respectively. The arrangement illustrated in FIG. 13 may be readily extended to triplexer, quadplexer or higher-order multiplexer configurations, as will be appreciated by those skilled in the art, given the benefit of this disclosure.

Aspects and embodiments demonstrate that one or more directional EM couplers can be integrated together with a filter (including one or more filter sections) to provide an integrated filter-coupler 300, allowing for reduced device footprint and avoiding the transmission loss associated with having a dedicated main coupler line. The integrated filter-coupler 300 can be used in various electronic modules including, for example, a diplexer, triplexer, quadplexer, or higher order multiplexer, that can be included a wide variety of electronic devices. As discussed above, the integrated filter-coupler 300 can include a multi-stage filter, and one or more coupler portions can be included at any one or more filter stages. Multiple coupler portions can be included to allow for simultaneous coupling of multiple frequencies at the same time. Including the coupler functionality with the filter may add some loss to the filter and have a relatively minor impact on the filter parameters; however, as discussed above, this is balanced by savings achieved in avoiding transmission loss and reducing the device footprint. According to certain examples, a circuit designer may design the filter based on desired filter characteristics and a specified coupling factor for the coupler portion(s), then adjust one or more filter components to compensate for the impact of the coupler portion(s). As discussed above, one or more filter components (such as any of the capacitive or inductive elements) can be adjustable to allow for tuning or optimization after design/manufacture.

Embodiments of the integrated filter-coupler 300 described herein can be implemented in a variety of different modules including, for example, a stand-alone filter-coupler module, a front-end module, a module combining the integrated filter-coupler with an antenna switching network, an impedance matching module, an antenna tuning module, or the like.

Figure 14:
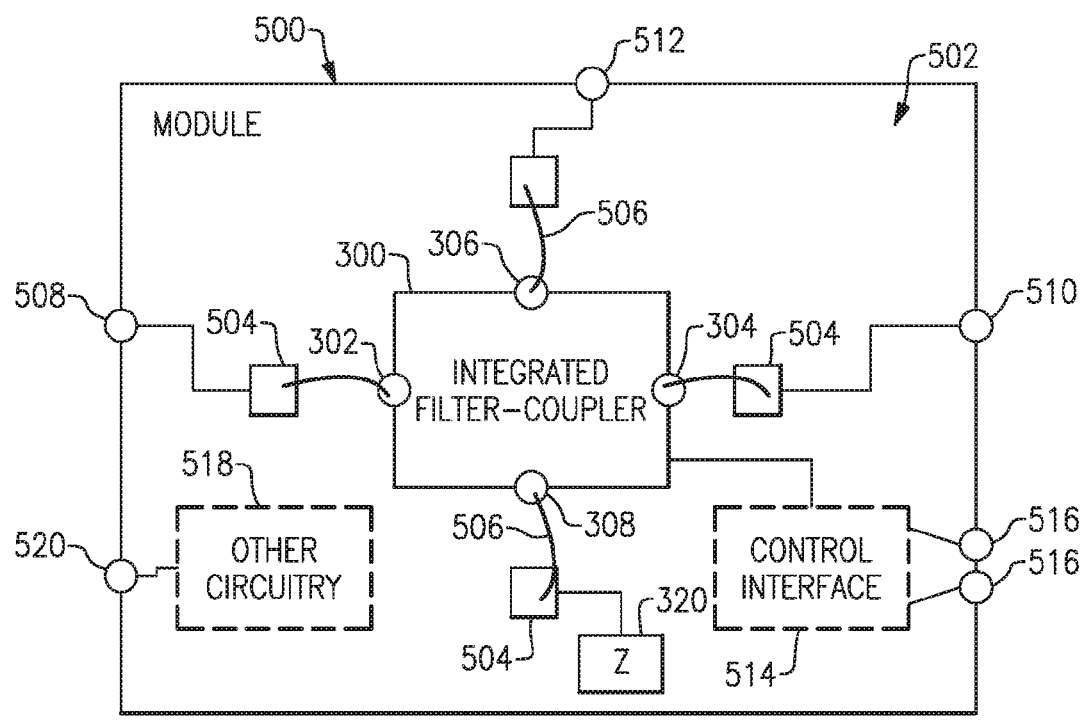
FIG. 14 is a block diagram of one example of a module including an integrated filter-coupler according to aspects of the present invention.

FIG. 14 is a block diagram of one example of a packaged module 500 that can include any of the embodiments or examples of the integrated filter-coupler 300 discussed herein. The packaged module 500 includes a packaging substrate 502 that is configured to receive a plurality of components, including the integrated filter-coupler 300. A plurality of connection pads 504 can be disposed on the packaging substrate 502, and the various ports, nodes, or terminals of the integrated filter-coupler 300 can be connected to the connection pads 504 via electrical connectors 506, which can be solder bumps or wirebonds, for example, to allow for passing of various signals to and from the integrated filter-coupler 300. In the example illustrated in FIG. 14, the termination impedance 320 is shown implemented on or in the packaging substrate 502 separate from the integrated filter-coupler die, and thus connected to the isolation port 308 of the integrated filter-coupler 300 via a connection pad 504 and electrical connector 506. However, in other examples the termination impedance 320 can be integrated within the integrated filter-coupler die.

The module 500 can include a plurality of signal terminals to which the connection pads 504 are electrically connected, to allow the module 500 to be in communication with other components and used in an electronic device. For example, the module 500 can include one or more input signal terminal(s) 508 configured to receive the RF (or other band) signals to be provided to the input port(s) 302 of the integrated filter-coupler 300, and one or more corresponding output signal terminal(s) 510 to provide the filtered RF signals from the output port(s) 304 of the integrated filter-coupler 300. The module 500 may similarly include one or more coupled signal terminal(s) 512 to provide the coupled signals from the integrated filter-coupler 300 to an external measurement device or sensor, for example. In certain examples the module 500 includes a data control interface 514, such as a serial or parallel data interface, for example, that can be connected to one or more corresponding data signal terminals 516. The control interface 514 may be used to control any of numerous parameters, characteristics, or configurations of the integrated filter-coupler 300. For example, the control interface can receive control signals (such as the impedance control signal 406) to actuate switches or adjust tunable components of the integrated filter-coupler 300. The module 500 may further include other circuitry 518, as will be appreciated by those skilled in the art, which may be electrically connected to one or more corresponding signal terminals 520. In some embodiments, the module 500 can also include one or more packaging structures to, for example, provide protection and facilitate easier handling of the module 500. Such a packaging structure can include an overmold (not shown) formed over the packaging substrate 502 and dimensioned to substantially encapsulate the various circuits and components thereon.

In the example shown in FIG. 14, the integrated filter-coupler 300 is shown as a die mounted on the packaging substrate 502. However, in other examples at least portions of the integrated filter-coupler 300 can be formed within one or more layers of the packaging substrate 502. In such examples, one or more of the input port 302, the output port 304, and the coupled port 306 may be directly connected to the corresponding signal terminal(s) 508, 510, or 512, by electrically conductive traces or vias, without the need for the connection pad(s) 504 and electrical connector(s) 506.

Embodiments of the integrated filter-coupler disclosed herein, optionally packaged into the module 500, may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, such as a microwave, refrigerator, or other appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a wrist watch, a clock, etc. Further, the electronic devices can include unfinished products.

Figure 15A:
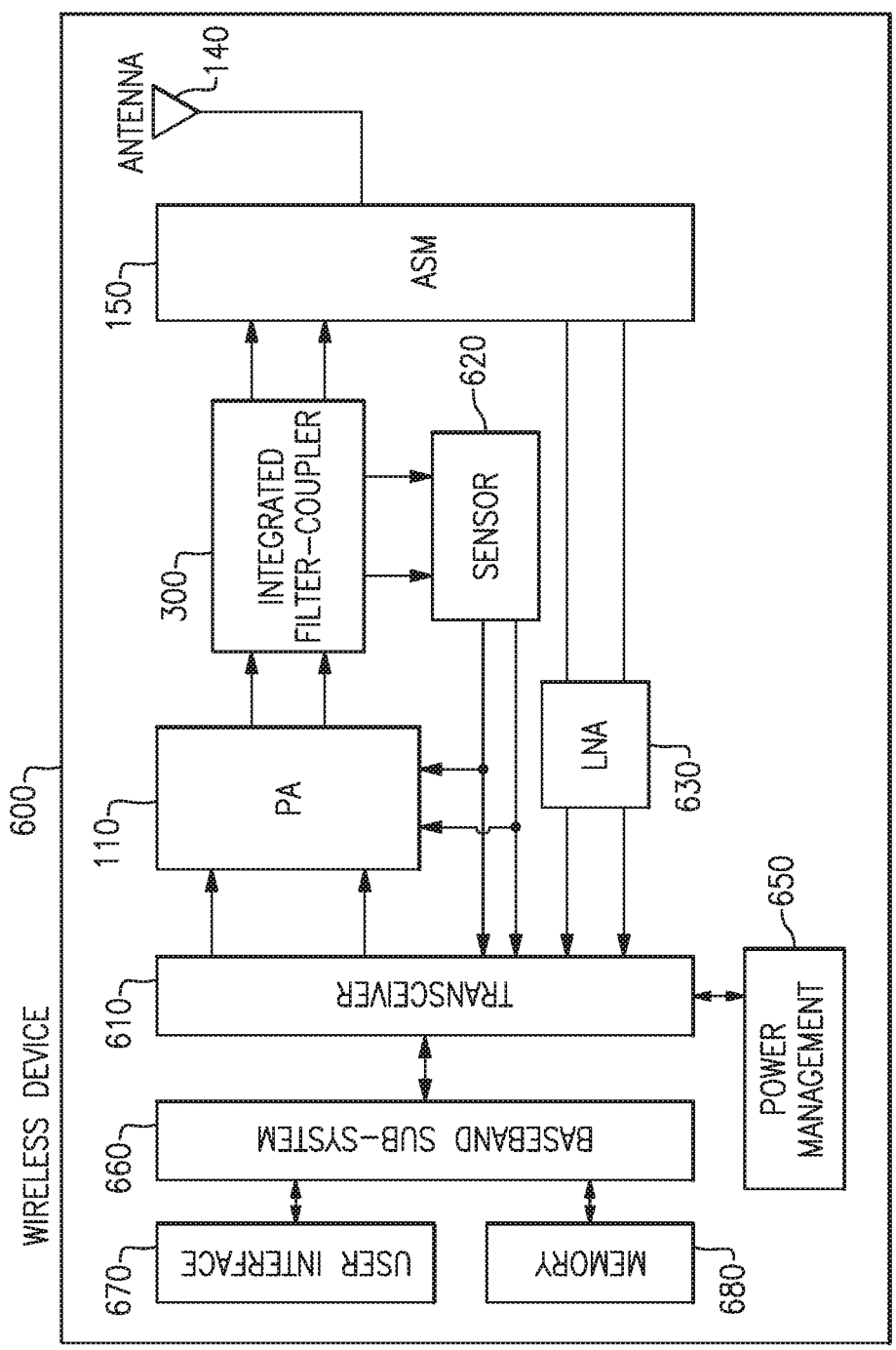
FIG. 15A is a block diagram of one example of a wireless device including an integrated filter-coupler according to aspects of the present invention.
Figure 15B:
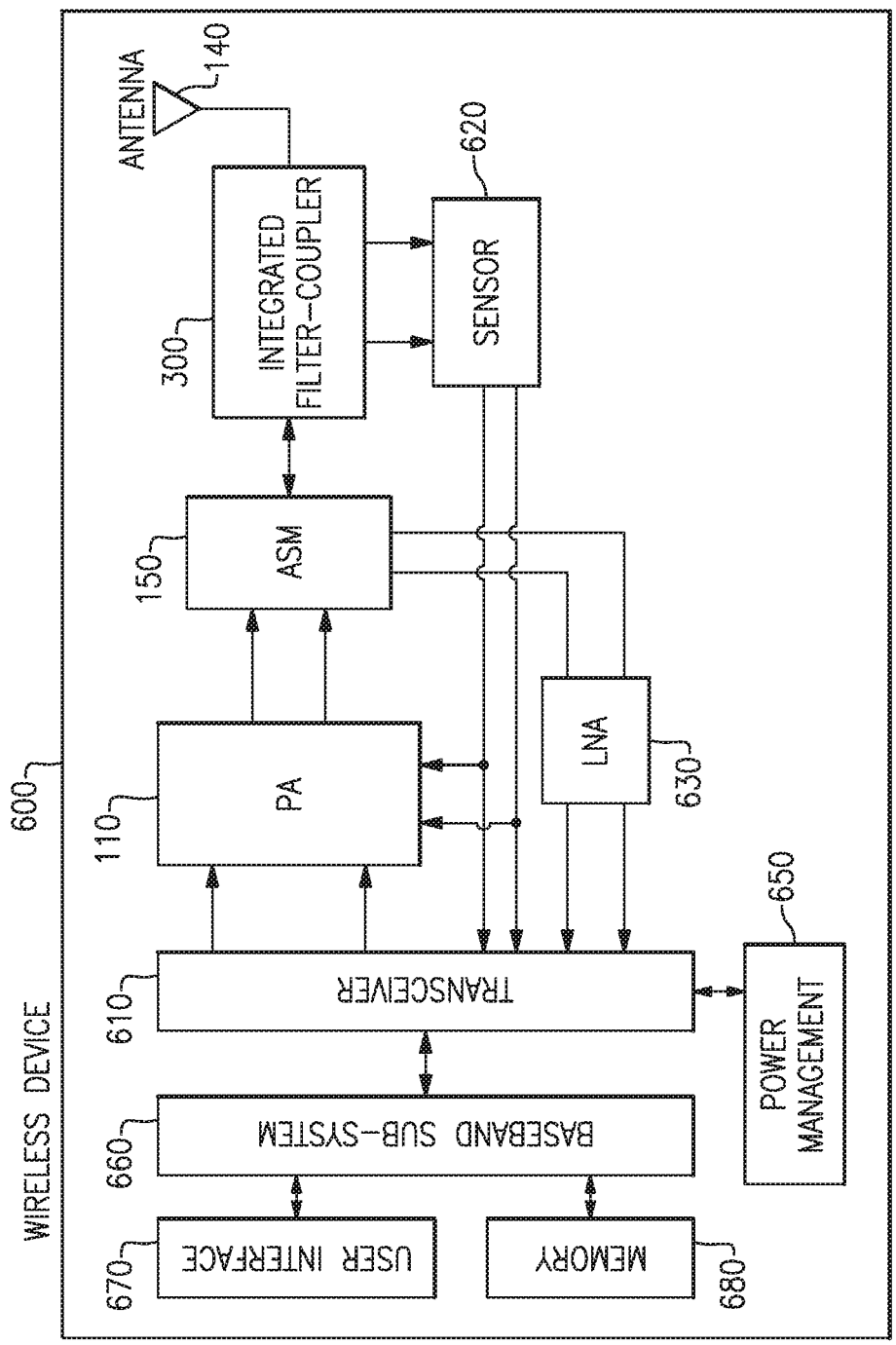
FIG. 15B is a block diagram showing another arrangement of the wireless device according to aspects of the present invention.

FIGS. 15A and 15B are block diagrams of examples of a wireless device 600 including an integrated filter-coupler 300 according to certain embodiments. The wireless device 600 can be a cellular phone, smart phone, tablet, modem, communication network or any other portable or non-portable device configured for voice and/or data communication. The wireless device 600 can receive and transmit signals from the antenna 140. The wireless device 600 includes a transceiver 610 that is configured to generate signals for transmission and/or to process received signals. In some embodiments, transmission and reception functionalities can be implemented in separate components (e.g. a transmit module and a receiving module), or be implemented in the same module.

Signals generated for transmission are received by the power amplifier (PA) module 110, which amplifies the generated signals from the transceiver 610. As will be appreciated by those skilled in the art, the power amplifier module 110 can include one or more power amplifiers. The power amplifier module 110 can be used to amplify a wide variety of RF or other frequency-band transmission signals. For example, the power amplifier module 110 can receive an enable signal that can be used to pulse the output of the power amplifier to aid in transmitting a wireless local area network (WLAN) signal or any other suitable pulsed signal.

The power amplifier module 110 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 110 and associated components including switches and the like can be fabricated on GaAs substrates using, for example, pHEMT or BiFET transistors, or on a Silicon substrate using CMOS transistors.

The wireless device 600 also includes the integrated filter-coupler 300 having one or more directional EM coupler sections for measuring transmitted power signals from the power amplifier module 110 and for providing one or more coupled signals to a sensor module 620. The sensor module 620 can in turn send information to the transceiver 610 and/or directly to the power amplifier module 110 as feedback for making adjustments to regulate the power level of the power amplifier module 110. In this way the integrated filter-coupler 300 can be used to boost/decrease the power of a transmission signal having a relatively low/high power. It will be appreciated, however, that the integrated filter-coupler 300 can be used in a variety of other implementations.

In certain embodiments in which the wireless device 600 is a mobile phone having a time division multiple access (TDMA) architecture, the integrated filter-coupler 300 can advantageously manage the amplification of an RF transmitted power signal from the power amplifier module 110. In a mobile phone having a time division multiple access (TDMA) architecture, such as those found in Global System for Mobile Communications (GSM), code division multiple access (CDMA), and wideband code division multiple access (W-CDMA) systems, the power amplifier module 110 can be used to shift power envelopes up and down within prescribed limits of power versus time. For instance, a particular mobile phone can be assigned a transmission time slot for a particular frequency channel. In this case the power amplifier module 110 can be employed to aid in regulating the power level one or more RF power signals over time, so as to prevent signal interference from transmission during an assigned receive time slot and to reduce power consumption. In such systems, the integrated filter-coupler 300 can be used to measure the power of a power amplifier output signal to aid in controlling the power amplifier module 110, as discussed above. The implementations shown in FIGS. 15A and 15B are exemplary and non-limiting. For example, the implementations of FIGS. 15A and 15B illustrate the integrated filter-coupler 300 being used in conjunction with a transmission of an RF signal, however, it will be appreciated that various examples of the integrated filter-coupler discussed herein can also be used with received RF signals or other signals as well.

Referring to FIG. 15A, the wireless device 600 includes an antenna switch module 150, which can be configured to switch between different bands and/or modes, transmit and receive modes etc. As shown in FIG. 15A, in certain embodiments the antenna 140 both receives signals that are provided to the transceiver 610 via the antenna switch module 150 and also transmits signals from the wireless device 600 via the transceiver 610, the power amplifier module 110, the integrated filter-coupler 300, and the antenna switch module 150. However, in other examples multiple antennas can be used. The receive path may include a low noise amplifier (LNA) module 630, which may include one or more low noise amplifiers configured to amplify the received signals.

Figure 15C:
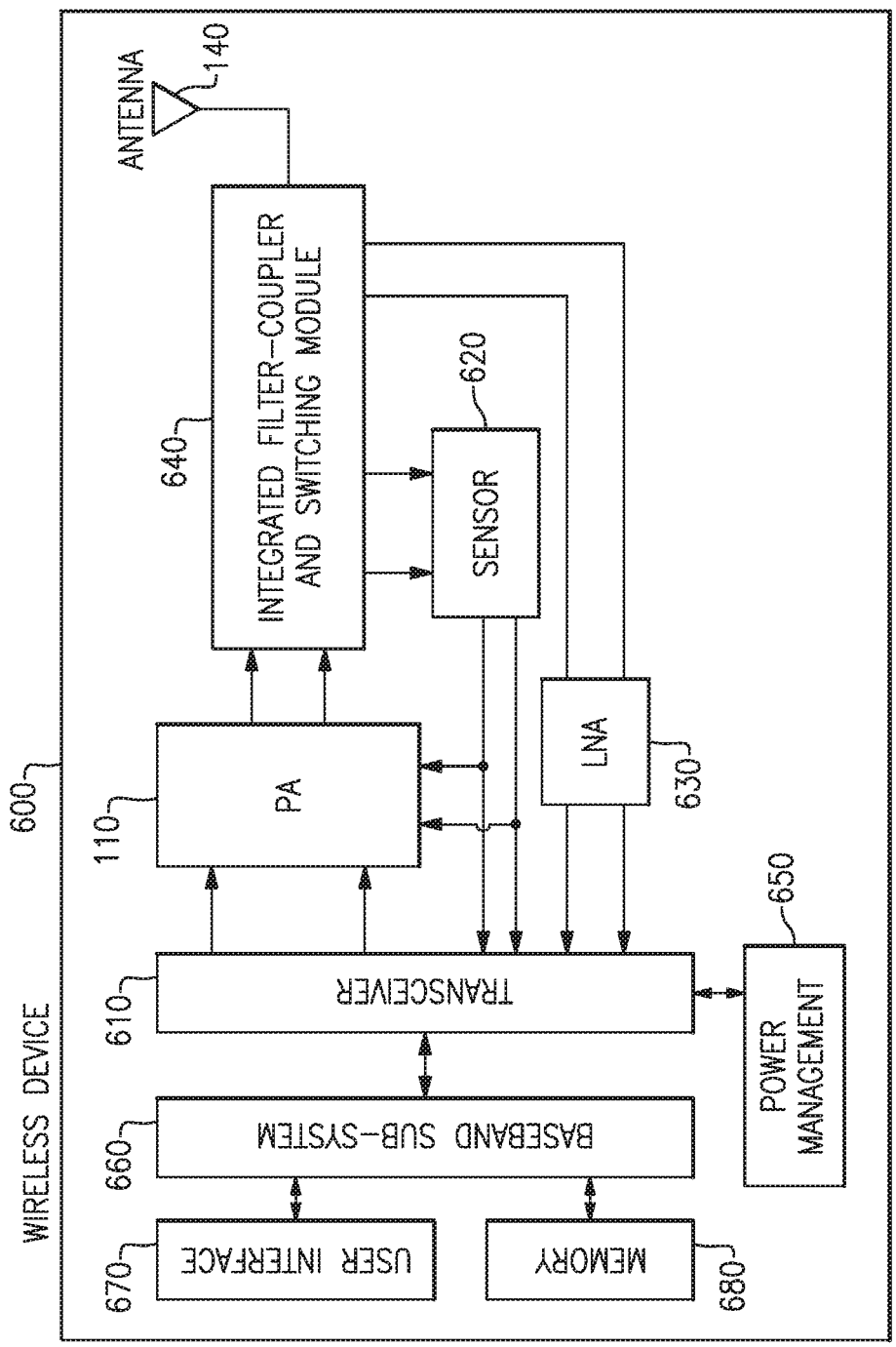
FIG. 15C is a block diagram of another example of the wireless device including an integrated filter-coupler and switching module according to aspects of the present invention.

In the example illustrated in FIG. 15A, the integrated filter-coupler module 300 is shown positioned between the power amplifier module 110 and the antenna switch module 150. However, as discussed above, the integrated filter-coupler module 300 can be connected at various locations along the transmit or receive signal path(s). For example, FIG. 15B illustrates an example of the wireless device 600 in which the integrated filter-coupler module 300 is positioned after the antenna switch module 150. Further, in the examples shown in FIGS. 15A and 15B, the integrated filter-coupler 300 is shown as an individual component; however, in other examples, the integrated filter-coupler 300 can be combined with one or more other components of the wireless device 600. For example, FIG. 15C illustrates an example of the wireless device 600 including an integrated filter-coupler and switching module 640 that combines the functionality of the integrated filter-coupler 300 and the antenna switch module 150. Given the benefit of this disclosure, those skilled in the art will appreciate that a variety of other configurations and combinations of the components of the wireless device 600 may be implemented.

The wireless device 600 of FIGS. 15A-C further includes a power management system 650 that is connected to the transceiver 610 and that manages the power for the operation of the wireless device. The power management system 650 can also control the operation of a baseband sub-system 660 and other components of the wireless device 600. The power management system 650 can include, or can be connected to, a battery (not shown) that supplies power for the various components of the wireless device 600. The power management system 650 can further include one or more processors or controllers that can control the transmission of signals and can also configure the integrated filter-coupler 300 based upon the frequency of the signals being transmitted, for example. In addition, the processor(s) or controller(s) of the power management system 650 may provide control signals to configure operation of the integrated filter-coupler 300, such as the impedance control signal 406 or other control signals to actuate switches, tune elements, or other configure the integrated filter-coupler 300.

In one embodiment, the baseband sub-system 660 is connected to a user interface 670 to facilitate various input and output of voice and/or data provided to and received from the user. The baseband sub-system 660 can also be connected to memory 680 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An integrated filter and electromagnetic coupler assembly comprising:
    an input port, an output port, a coupled port, an additional coupled port, and an isolation port;
    a termination impedance connected to the isolation port;
    a filter including a capacitance, a first series inductance, and a second series inductance, the first and second series inductances being connected in series along a series path between the input port and the output port;

a first coupling element positioned physically proximate the first series inductance and extending between the coupled port and the isolation port, the first series inductance and the first coupling element being configured to provide a coupled signal at the coupled port in response to an input signal being received at the input port, the coupled signal being derived from the input signal via inductive coupling between the first series inductance and the first coupling element; and a second coupling element positioned physically proximate the second series inductor and connected to the additional coupled port.

2. The integrated filter and electromagnetic coupler assembly of claim 1 wherein the capacitance includes at least one variable capacitor.

3. The integrated filter and electromagnetic coupler assembly of claim 1 wherein the second coupling element and the second series inductance are configured to provide at the additional coupled port an indication of power of a reflection of the input signal from the output port.

4. The integrated filter and electromagnetic coupler assembly of claim 1 wherein the first coupling element and the first series inductance are configured to provide at the coupled port the coupled signal in a first frequency band, and the second coupling element and the second series inductance are configured to provide at the additional coupled port an additional coupled signal in a second frequency band, the first and second frequency bands being different.

5. The integrated filter and electromagnetic coupler assembly of claim 4 further comprising at least one frequency selective component connected to a corresponding at least one of the coupled port and the additional coupled port.

6. The integrated filter and electromagnetic coupler assembly of claim 1 wherein the filter is a T-type filter.

7. The integrated filter and electromagnetic coupler assembly of claim 1 wherein the first coupling element is a transmission line.

8. The integrated filter and electromagnetic coupler assembly of claim 1 wherein the termination impedance is adjustable.

9. The integrated filter and electromagnetic coupler assembly of claim 1 wherein the capacitance includes at least one series capacitor connected in parallel with the first series inductance, and the filter further includes at least one shunt arm connected between the series path and a ground, the at least one shunt arm including a shunt capacitance and a shunt inductance connected in series with the shunt capacitance between the series path and the ground.

10. An integrated filter and electromagnetic coupler assembly comprising:

an input port, an output port, a coupled port, and an isolation port;

a termination impedance connected to the isolation port;

a filter including a capacitance, a first series inductance, and a second series inductance, the first and second series inductances being connected in series along a series path between the input port and the output port;

a first coupling element positioned physically proximate the first series inductance and extending between the coupled port and the isolation port, the first series inductance and the first coupling element being configured to provide a coupled signal at the coupled port in response to an input signal being received at the input port, the coupled signal being derived from the input signal via inductive coupling between the first series inductance and the first coupling element;

a second coupling element positioned physically proximate the second series inductance; and a coupling switch configured to connect the second coupling element to the first coupling element in series between the coupled port and the isolation port.

11. The integrated filter and electromagnetic coupler assembly of claim 10 wherein the filter is a pi-type filter, the capacitance includes a series capacitor connected in parallel with the first series inductance, and the filter further includes a first shunt capacitor, a second shunt capacitor, a first shunt inductor, and a second shunt inductor, the first shunt capacitor and the first shunt inductor being connected in series between the input port and a ground, and the second shunt capacitor and the second shunt inductor being connected in series between the output port and the ground.

12. The integrated filter and electromagnetic coupler assembly of claim 10 wherein the termination impedance is adjustable.

13. The integrated filter and electromagnetic coupler assembly of claim 10 wherein the capacitance includes at least one series capacitor connected in parallel with the first series inductance, and the filter further includes at least one shunt arm connected between the series path and a ground, the at least one shunt arm including a shunt capacitance and a shunt inductance connected in series with the shunt capacitance between the series path and the ground.

14. The integrated filter and electromagnetic coupler assembly of claim 13 further comprising a third coupling element positioned physically proximate the shunt inductance and extending between an additional coupled port and an additional isolation port of the integrated filter and electromagnetic coupler assembly, the third coupling element and the shunt inductance being configured to provide at the additional coupled port a harmonic coupled signal via inductive coupling between the shunt inductance and the third coupling element in response to the input signal being received at the input port, the harmonic coupled signal being representative of at least one harmonic of the input signal.

15. A front-end module for a wireless device comprising:

an integrated filter and electromagnetic coupler assembly having an input port, an output port, a coupled port, and an isolation port, the integrated filter and electromagnetic coupler assembly including a filter and a coupling element, the filter having a capacitance and a series inductance, the coupling element being positioned physically proximate the series inductance and extending between the coupled port and the isolation port, the series inductance being connected between the input port and the output port, and the coupling element and the series inductance being configured to provide a coupled signal at the coupled port in response to an input signal being received at the input port; and a power amplifier module coupled to the input port of the integrated filter and electromagnetic coupler assembly and configured to provide the input signal.

16. The front-end module of claim 15 further comprising an antenna switch connected to the output port of the integrated filter and electromagnetic coupler assembly.

17. The front-end module of claim 15 further comprising an antenna switch connected between the power amplifier module and the input port of the integrated filter and electromagnetic coupler assembly.

18. The front end module of claim 15 wherein the capacitance includes at least one series capacitor connected in parallel with the first series inductance, and the filter further includes at least one shunt arm connected between the series path and a ground, the at least one shunt arm including a shunt capacitance and a shunt inductance connected in series with the shunt capacitance between the series path and the ground.

19. A wireless device comprising:
an integrated filter and electromagnetic coupler assembly having an input port, an output port, a coupled port, and an isolation port, the integrated filter and electromagnetic coupler assembly including a filter and a coupling element, the filter having a capacitance and a series inductance, the coupling element being positioned physically proximate the series inductance and extending between the coupled port and the isolation port, the series inductance being connected between the input port and the output port, and the coupling element and the series inductance being configured to provide a coupled signal at the coupled port in response to an input signal being received at the input port;
a transceiver configured to produce a transmit signal;
a power amplifier module coupled to the transceiver and to the input port of the integrated filter and electromagnetic coupler assembly, the power amplifier module being configured to receive the transmit signal from the transceiver and to amplify the transmit signal to provide the input signal;
an antenna coupled to the output port of the integrated filter and electromagnetic coupler assembly; and
a sensor connected to the coupled port of the integrated filter and electromagnetic coupler assembly and configured to detect the coupled signal.

20. The wireless device of claim 19 wherein the capacitance includes at least one series capacitor connected in parallel with the first series inductance, and the filter further includes at least one shunt arm connected between the series path and a ground, the at least one shunt arm including a shunt capacitance and a shunt inductance connected in series with the shunt capacitance between the series path and the ground.

21. An integrated filter and electromagnetic coupler assembly comprising:
an input port, an output port, a first coupled port, a second coupled port, a first isolation port, and a second isolation port;
a termination impedance connected to the first isolation port;
a filter including a capacitance, a first series inductance, and at least one shunt arm, the first series inductance being connected along a series path between the input port and the output port, the capacitance including at least one series capacitor connected in parallel with the first series inductance; the at least one shunt arm being connected between the series path and a ground, and the at least one shunt arm including a shunt capacitance and a shunt inductance connected in series with the shunt capacitance between the series path and the ground;
a first coupling element positioned physically proximate the first series inductance and extending between the first coupled port and the first isolation port, the first series inductance and the first coupling element being configured to provide a coupled signal at the first coupled port in response to an input signal being received at the input port, the coupled signal being derived from the input signal via inductive coupling between the first series inductance and the first coupling element; and
a second coupling element positioned physically proximate the shunt inductance and extending between the second coupled port and the second isolation port, the second coupling element and the shunt inductance being configured to provide at the second coupled port a harmonic coupled signal via inductive coupling between the shunt inductance and the second coupling element in response to the input signal being received at the input port, the harmonic coupled signal being representative of at least one harmonic of the input signal.

* * * * *